(12) United States Patent
Nakamura

(10) Patent No.: US 9,911,768 B2
(45) Date of Patent: Mar. 6, 2018

(54) SOLID STATE IMAGING DEVICE AND ELECTRONIC APPARATUS

(71) Applicant: SONY CORPORATION, Tokyo (JP)

(72) Inventor: Akihiro Nakamura, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/898,595

(22) PCT Filed: Apr. 27, 2015

(86) PCT No.: PCT/JP2015/062689
§ 371 (c)(1),
(2) Date: Dec. 15, 2015

(87) PCT Pub. No.: WO2015/170628
PCT Pub. Date: Nov. 12, 2015

(65) Prior Publication Data
US 2017/0053956 A1    Feb. 23, 2017

(30) Foreign Application Priority Data

May 9, 2014 (JP) .................................. 2014-097341

(51) Int. Cl.
| H01L 27/146 | (2006.01) |
| H04N 5/369 | (2011.01) |
| H04N 5/372 | (2011.01) |
| H04N 5/374 | (2011.01) |

(52) U.S. Cl.
CPC .. H01L 27/14605 (2013.01); H01L 27/14607 (2013.01); H01L 27/14612 (2013.01);
(Continued)

(58) Field of Classification Search
CPC ............. H01L 51/0008; H01L 51/524; H01L 51/5256; H01L 51/56; H01L 27/14605;
(Continued)

(56) References Cited

U.S. PATENT DOCUMENTS 4,907,054 A * 3/1990 Berger ............. H01L 27/14665
257/443
6,008,511 A * 12/1999 Tokumitsu ........ H01L 27/14621
257/232
(Continued)

FOREIGN PATENT DOCUMENTS

| JP | 2004-172273 A | 6/2004 |
| JP | 2009-158800 A | 7/2009 |

(Continued)

Primary Examiner — Allan R Wilson
(74) Attorney, Agent, or Firm — Chip Law Group

(57) ABSTRACT

The present disclosure relates to a solid state imaging device in which, in phase difference pixels that do not include a light blocking layer for forming a phase difference, the phase difference detection characteristics can be made uniform regardless of the image height. Provided is a solid state imaging device including a pixel array unit in which a plurality of pixels are two-dimensionally arranged in a matrix configuration. Part of the pixels in the pixel array unit include a first photoelectric conversion element and a second photoelectric conversion element configured to receive and photoelectrically convert incident light. A center position of a light receiving characteristic distribution of the first photoelectric conversion element and a center position of a light receiving characteristic distribution of the second photoelectric conversion element are configured so as to be the same between a central portion and a peripheral portion of the pixel array unit.

16 Claims, 17 Drawing Sheets

(52) U.S. Cl.
CPC .. *H01L 27/14623* (2013.01); *H01L 27/14627* (2013.01); *H01L 27/14641* (2013.01); *H04N 5/369* (2013.01); *H04N 5/372* (2013.01); *H04N 5/374* (2013.01)

(58) Field of Classification Search
CPC ......... H01L 27/14607; H01L 27/14612; H01L 27/14623; H01L 27/14627; H01L 27/14641; H04N 5/369; H04N 5/372; H04N 5/374
See application file for complete search history.

(56) References Cited

U.S. PATENT DOCUMENTS

| | | | | |
|---|---|---|---|---|
| 6,518,640 | B2 * | 2/2003 | Suzuki | H01L 27/14601 257/229 |
| 2005/0104982 | A1 * | 5/2005 | Shimazu | H04N 9/045 348/294 |
| 2007/0053037 | A1 * | 3/2007 | Kang | H01L 27/14621 359/204.1 |
| 2013/0021521 | A1 | 1/2013 | Hamada | |
| 2013/0087877 | A1 * | 4/2013 | Sakaguchi | H01L 31/02016 257/443 |

FOREIGN PATENT DOCUMENTS

| | | |
|---|---|---|
| JP | 2009-290157 A | 12/2009 |
| JP | 2012-043939 A | 3/2012 |
| JP | 2012-182332 A | 9/2012 |
| JP | 2013-115289 A | 6/2013 |
| JP | 2013-149757 A | 8/2013 |
| JP | 2014-033107 A | 2/2014 |
| WO | 2013145433 A1 | 10/2013 |

* cited by examiner

SOLID STATE IMAGING DEVICE AND ELECTRONIC APPARATUS

TECHNICAL FIELD

The present disclosure relates to a solid state imaging device and an electronic apparatus, and relates particularly to a solid state imaging device and an electronic apparatus in which, in phase difference pixels that do not include a light blocking layer for forming a phase difference, the phase difference detection characteristics can be made uniform regardless of the image height.

BACKGROUND ART

There is proposed a solid state imaging device in which, in phase difference pixels that block part of the light receiving region using a light blocking layer and detect the phase difference, the phase difference detection characteristics are made uniform, regardless of the image height by varying the position of the imaging point of of the subject light that has passed through a microlens and the position of the opening end of the light blocking layer in accordance with the variation in image height (e.g. see Patent Literature 1).

CITATION LIST

Patent Literature

Patent Literature 1: JP 2012-182332A

SUMMARY OF INVENTION

Technical Problem

However, the technology disclosed in Patent Literature 1 cannot be employed in a phase difference pixel of a type in which a plurality of light receiving regions are provided in one pixel and the phase difference is detected on the basis of signals obtained from the light receiving regions, because there is no light blocking layer. That is, the technology disclosed in Patent Literature 1 can be applied to a pixel including a light blocking layer, but the technology disclosed in Patent Literature 1 cannot be employed in a pixel that does not include a light blocking layer and divides the light receiving region.

The present disclosure is carried out in view of such circumstances, and enables the phase difference detection characteristics to be made uniform regardless of the image height in phase difference pixels that do not include a light blocking layer for forming a phase difference.

Solution to Problem

According to a first aspect of the present disclosure, there is provided a solid state imaging device including a pixel array unit in which a plurality of pixels are two-dimensionally arranged in a matrix configuration. Part of the pixels in the pixel array unit include a first photoelectric conversion element and a second photoelectric conversion element configured to receive and photoelectrically convert incident light. A center position of a light receiving characteristic distribution of the first photoelectric conversion element and a center position of a light receiving characteristic distribution of the second photoelectric conversion element are configured so as to be the same between a central portion and a peripheral portion of the pixel array unit.

According to a second aspect of the present disclosure, there is provided an electronic apparatus including a solid state imaging device, the solid state imaging device including a pixel array unit in which a plurality of pixels are two-dimensionally arranged in a matrix configuration. Part of the pixels in the pixel array unit include a first photoelectric conversion element and a second photoelectric conversion element configured to receive and photoelectrically convert incident light. A center position of a light receiving characteristic distribution of the first photoelectric conversion element and a center position of a light receiving characteristic distribution of the second photoelectric conversion element are configured so as to be the same between a central portion and a peripheral portion of the pixel array unit.

In the first and second aspects of the present disclosure, part of the pixels in a pixel array unit in which a plurality of pixels are two-dimensionally arranged in a matrix configuration include a first photoelectric conversion element and a second photoelectric conversion element configured to receive and photoelectrically convert incident light. A center position of a light receiving characteristic distribution of the first photoelectric conversion element and a center position of a light receiving characteristic distribution of the second photoelectric conversion element are configured so as to be the same between a central portion and a peripheral portion of the pixel array unit.

The solid state imaging device and the electronic apparatus may be an independent device, or may be a module incorporated in some other device.

Advantageous Effects of Invention

According to a first aspect and a second aspect of the present disclosure, the phase difference detection characteristics can be made uniform regardless of the image height in phase difference pixels that do not include a light blocking layer for forming a phase difference.

The effect described herein is not necessarily a limitative one, and any effect described in the present disclosure may be exhibited.

DESCRIPTION OF EMBODIMENTS

Hereinbelow, embodiments of the present disclosure (hereinafter referred to as embodiments) are described. The description is given in the following order.
1. Configuration Example of the Electronic Apparatus
2. Rough Configuration Examples of the Solid State Imaging Device
3. With Regard to the Influence of Vignetting on Phase Difference Detection
4. First Embodiment of the Phase Difference Pixel (A Configuration in Which the Arrangement of Photodiodes is Varied)
5. Second Embodiment of the Phase Difference Pixel (A Configuration in Which the Reset Voltage is Varied)
6. Example of Application to a CCD
7. Other Application Examples <1. Configuration Example of the Electronic Apparatus>

Figure 1:
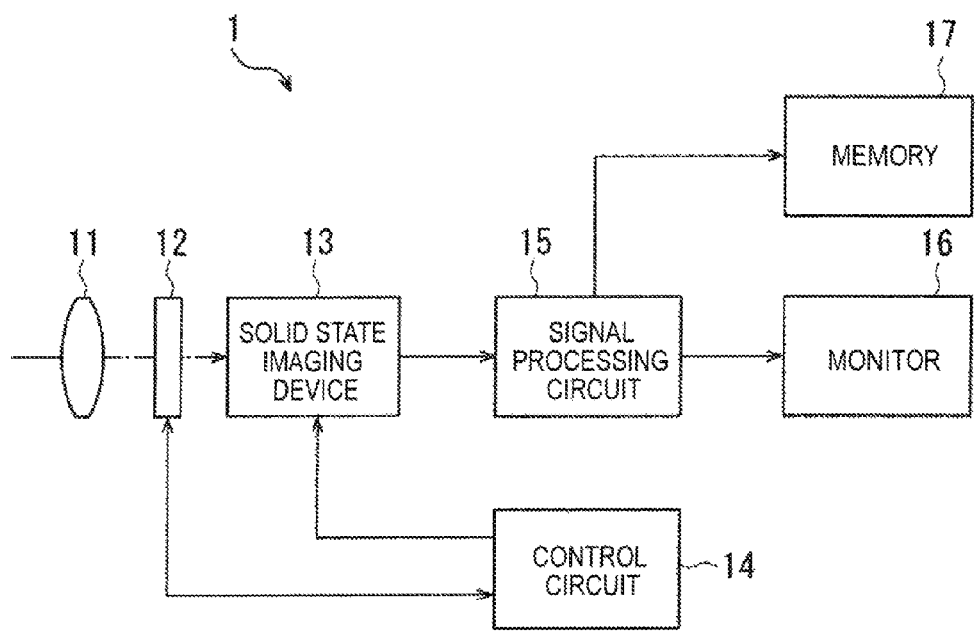
FIG. 1 is a block diagram showing a configuration example of an imaging apparatus as an electronic apparatus according to the present disclosure.

FIG. 1 is a block diagram showing an configuration example of an imaging apparatus as an electronic apparatus according to the present disclosure.

An imaging apparatus 1 shown in FIG. 1 is configured to include an optical system 11, a shutter device 12, a solid state imaging device 13, a control circuit 14, a signal processing circuit 15, a monitor 16, and a memory 17. The imaging apparatus 1 is a digital still camera, a digital video camera, or the like, for example, and can image still images and moving images.

The optical system 11 is configured to include one or a plurality of lenses, and guides the light from a subject (incident light) to the solid state imaging device 13 and forms an image on the light receiving surface of the solid state imaging device 13.

The shutter device 12 is disposed between the optical system 11 and the solid state imaging device 13, and controls the light irradiation period and the light blocking period to the solid state imaging device 13 in accordance with the control of the control circuit 14.

The solid state imaging device 13 stores a signal charge for a certain period of time in accordance with the light that is formed as an image on the light receiving surface via the optical system 11 and the shutter device 12. The signal charge stored in the solid state imaging device 13 is transferred in accordance with a drive signal (timing signal) supplied from the control circuit 14. The solid state imaging device 13 may be formed as one chip by itself, or may be formed as part of a camera module that is packaged together with the optical system 11, the signal processing circuit 15, etc.

The control circuit 14 outputs a drive signal that controls the transfer operation of the solid state imaging device 13 and the shutter operation of the shutter device 12, and drives the solid state imaging device 13 and the shutter device 12.

The signal processing circuit 15 performs various signal processings on a pixel signal outputted from the solid state imaging device 13. The image (image data) obtained by the implementation of signal processing by the signal processing circuit 15 is supplied to and displayed on the monitor 16, or is supplied to and stored (recorded) in the memory 17.

<2. Rough Configuration Examples of the Solid State Imaging Device>

Figure 2:
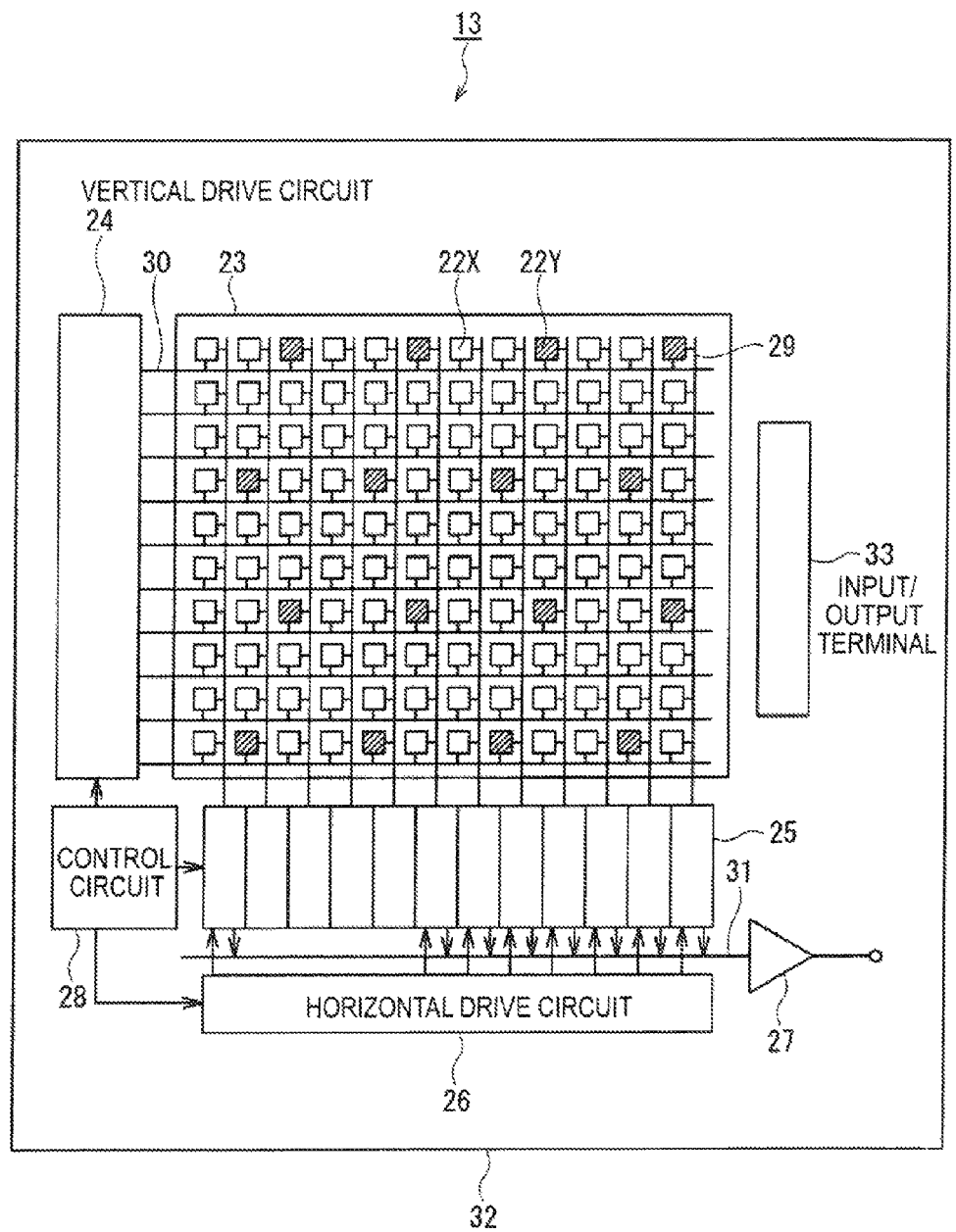
FIG. 2 is a diagram showing a rough configuration of a solid state imaging device according to the present disclosure.

FIG. 2 shows a rough configuration of the solid state imaging device 13 of FIG. 1.

The solid state imaging device 13 is configured to include a pixel array unit 23 in which pixels 22 are two-dimensionally arranged in a matrix configuration and a peripheral circuit unit around the pixel army unit 23, on a semiconductor substrate 32 using, for example, silicon (Si) as a semiconductor. In the peripheral circuit unit, a vertical drive circuit 24, a column signal processing circuit 25, a horizontal drive circuit 26, an output circuit 21, a control circuit 28, etc. are included.

In the pixel array unit 23, the pixels 22 two-dimensionally arranged in a matrix configuration include an imaging pixel 22X that produces a signal for image production and a phase difference pixel 22Y that produces a signal for focus detection. Phase difference pixels 22Y are arranged regularly or randomly in the pixel array unit 23. Although the phase difference pixel 22Y is disposed every several pixels in the example of FIG. 2, the phase difference pixel 22Y may be disposed such that the entire one column or the entire one row is composed of phase difference pixels 22Y, for example. The difference between the imaging pixel 22X and the phase difference pixel 22Y is described later with reference to FIG. 3 etc.

The pixel 22 is configured to include a photodiode as a photoelectric conversion element and a plurality of pixel transistors (what is called MOS transistors). The plurality of pixel transistors are composed of, for example, four MOS transistors of a transfer transistor, a select transistor, a reset transistor, and an amplifying transistor.

The pixel 22 may be a shared pixel structure. The pixel shared structure is composed of a plurality of photodiodes, a plurality of transfer transistors, one shared floating diffusion (a floating diffusion region), and other shared one-by-one pixel transistors. That is, in the shared pixels, the photodiodes and the transfer transistors constituting a plurality of unit pixels are configured to share other shared one-by-one pixel transistors.

The control circuit 28 receives an input clock and data of ordering the operating mode etc., and outputs data of internal information etc. of the solid state imaging device 13. That is, the control circuit 28 produces a clock signal and a control signal serving as a standard of the operation of the vertical drive circuit 24, the column signal processing circuit 25, the horizontal drive circuit 26, etc. on the basis of a vertical synchronizing signal, a horizontal synchronizing signal, and a master clock. Then, the control circuit 28 outputs the produced clock signal and control signal to the vertical drive circuit 24, the column signal processing circuit 25, the horizontal drive circuit 26, etc.

The vertical drive circuit 24 is formed of, for example, a shift register; and selects a pixel drive interconnection 30 and supplies a pulse for driving the pixel 22 to the selected pixel drive interconnection 30 to drive pixels 22 on a row basis. That is, the vertical drive circuit 24 selectively scans each pixel 22 in the pixel array unit 23 sequentially in the vertical direction on a row basis, and supplies the column signal processing circuit 25 with, via a vertical signal line 29, a pixel signal based on a signal charge generated in accordance with the received light quantity in the photoelectric conversion element in each pixel 22.

The column signal processing circuit 25 is disposed for each column, of pixels 22, for example, and performs signal processing such as denoising on the signal outputted from each pixel 22 of one row for each pixel column. For example, the column signal processing circuit 25 performs signal processing such as correlated double sampling (CDS) for removing fixed pattern noise peculiar to the pixel, A/D conversion, etc.

The horizontal drive circuit 26 is formed of, for example, a shift register; and sequentially selects each of the column signal processing circuits 25 by sequentially outpacing a horizontal scan pulse, and causes s pixel signal to be outputted from each of the column signal processing circuits 25 to a horizontal signal line 31.

The output circuit 27 performs signal processing on the signal sequentially supplied from each of the column signal processing circuits 25 via the horizontal signal line 31, and outputs the processed signal. The output circuit 27 may perform only buffering or may perform black level, adjustment, column variation correction, various digital signal processings, etc., for example. Input/output terminals 33 exchange signals with the outside.

The solid state imaging device 13 thus configured is a CMOS image sensor called a column A/D system in which the column signal processing circuit 25 that performs CDS processing and A/D conversion processing is disposed for each pixel column.

The solid state imaging device 13 may be mounted in, as well as the imaging apparatus 1 of FIG. 1, various electronic apparatuses such as mobile phones having an imaging function or audio players having an imaging function.

<Cross-Sectional Configuration View of the Pixels>

Figure 3:
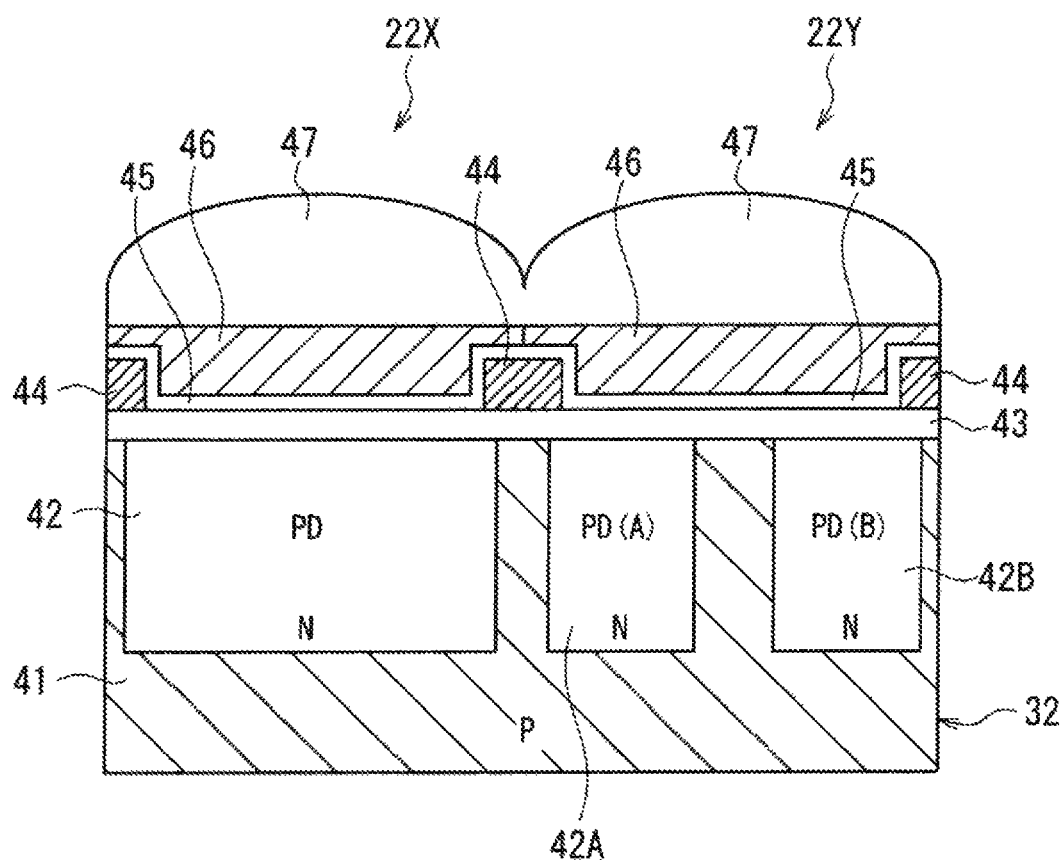
FIG. 3 is a diagram showing a cross-sectional configuration of an imaging pixel and a phase difference pixel of the solid state imaging device.

FIG. 3 is a diagram showing a cross-sectional configuration of the imaging pixel 22X and the phase difference pixel 22Y of the solid state imaging device 13 of FIG. 1.

In the imaging pixel 22X of the solid state imaging device 1, a photodiode PD is formed in units of a pixel by, for example, forming an N-type (a second conductivity type) semiconductor region 42 in a P-type (a first conductivity type) semiconductor region 41 of the semiconductor substrate 32.

On the other hand, in the phase difference pixel 22Y, two photodiodes PD(A) and PD(B) are formed for one pixel by forming two N-type semiconductor regions 42A and 42B in the P-type semiconductor region 41 of the semiconductor substrate 32.

Here, the impurity concentration, of the P-type semiconductor region 41 on the inside (the pixel center side) between the two N-type semiconductor regions 42A and 42B is formed lower than the impurity concentration of the P-type semiconductor region 41 on the outside (the pixel boundary side) of the semiconductor region 42A and the semiconductor region 42B. In other words, the concentration gradient of the P-N junction on the inside of the photodiodes PD(A) and PD(B) is formed so as to be gentler than the concentration gradient of the P-N junction on the outside of the photodiodes PD(A) and PD(B).

On the front surface side of the semiconductor substrate 32 (the lower side of the drawing), a plurality of pixel transistors that perform the reading of the charge stored in the photodiodes PD, PD(A), and PD(B) etc. and a multiple-layer interconnection layer composed of a plurality of interconnection layers and interlayer insulating films are formed (neither shown in the drawing).

At the interface on the back surface side of the semiconductor substrate 32 (the upper side of the drawing), for example, an anti-reflection film (insulating layer) 43 formed of, for example, a silicon oxide film or the like is formed.

A light blocking film 44 is formed at the pixel boundary on the upper side of the anti-reflection film 43. The light blocking film 44 needs only to be a material that blocks light, and is preferably a material that has strong light blocking effect and can be processed by microprocessing, such as etching, with good accuracy. The light blocking film 44 may be formed of, for example, a metal film of tungsten (W), aluminum (Al), copper (Cu), titanium (Ti), molybdenum (Mo), nickel (Ni), or the like.

A color filter 46 is formed on the anti-reflection film 43 including the light blocking film 44 via an oxide film 45 such, as a TEOS film. The color filter 46 is formed by, for example, applying a photosensitive resin containing a coloring matter such as a pigment or a dye by spin coating. For the color filter 46, each color of red (R), green (G), and blue (B) is formed for each pixel in a prescribed arrangement such as the Bayer arrangement.

A microlens (on-chip lens) 47 is formed on the color filter 46. The microlens 47 is formed of, for example, a resin-based material such as a styrene-based resin, an acrylic-based resin, a styrene-acrylic copolymer-based resin, or a siloxane-based resin.

The imaging pixel 22X and the phase difference pixel 22Y are configured in the above manner, and the solid state imaging device 1 is a back-side illumination CMOS solid state imaging device on which light is incident from the back surface side on the opposite side to the frost surface side of the semiconductor substrate 32 in which pixel transistors are formed.

There is generally a phase difference pixel with a structure in which the right half or the left half of the light receiving region of a photodiode is shielded from light by a light blocking film. However, the phase difference pixel 22Y of the embodiment does not include a light blocking film for forming a phase difference, and two separated photoelectric conversion elements, namely, the photodiodes PD(A) and PD(B) are formed in the pixel. Due to the fact that the formation positions of the photodiodes PD(A) and PD(B) are different, a shift occurs in the image produced from the two photodiodes PP(A) and PD(B). The shift in the image is used to calculate the phase shift amount to calculate the defocus amount, and the photographing lens is adjusted (moved); thereby, autofocus can be achieved.

<Circuit Configuration Examples of the Phase Difference Pixel>

Figure 4:
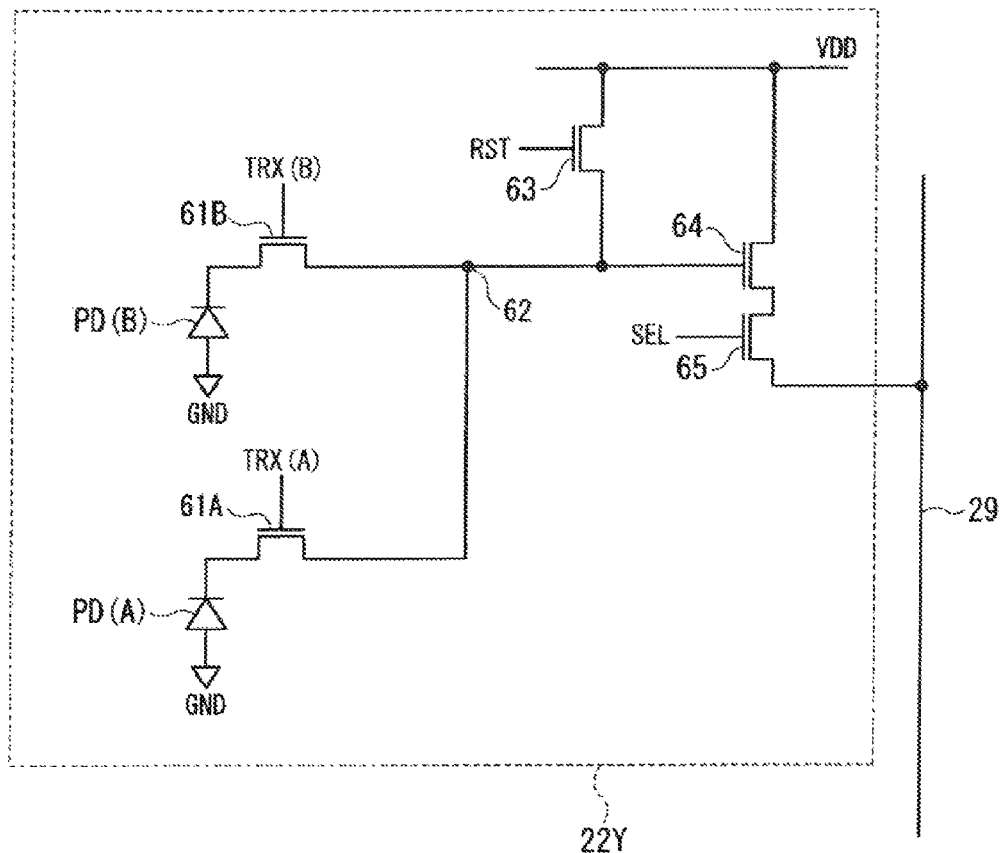
FIG. 4 is a diagram showing a circuit configuration example of the phase difference pixel.

FIG. 4 shows a circuit configuration example of the phase difference pixel 22Y.

The phase difference pixel 22Y includes the photodiodes PD(A) and PD(B), transfer transistors 61A and 61B, a floating diffusion (FD) 62, a reset transistor 63, an amplifying transistor 64, and a select transistor 65.

Each of the photodiodes PD(A) and PD(B) generates and stores a charge (signal charge) in accordance with the received light quantity. The anode terminals of the photodiodes PD(A) and PD(B) are grounded, and the cathode terminals are connected to the FD 62 via the transfer transistors 61A and 61B.

The transfer transistor 61A, when switched to ON by a transfer signal TRX(A), reads the charge generated by the photodiode PD(A) and transfers the charge to the FD 62. The transfer transistor 61B, when switched to ON by a transfer signal TRX(B), reads the charge generated by the photodiode PD(B) and transfers the charge to the FD 62.

The FD 62 retains the charge read from the photodiode PD(A) or PD(B). The reset transistor 63, when switched to ON by a reset signal RST, resets the electric potential of the FD 62 by the charge stored in the FD 62 being released to the drain (a constant voltage source Vdd).

The amplifying transistor 64 outputs a pixel signal in accordance with the electric potential of the FD 62. That is, the amplifying transistor 64 forms a source follower circuit along with a load MOS (not shown) as a constant current source which is connected via the vertical signal line 29; and a pixel signal that indicates a level in accordance with the charge stored in the FD 62 is outputted from the amplifying transistor 64 to the column signal processing circuit 25 via the select transistor 65.

When the phase difference pixel 22Y is selected by a select signal SEL, the select transistor 65 is switched to ON, and outputs the pixel signal of the phase difference pixel 22Y to the column signal processing circuit 25 via the vertical signal line 29. Each signal line through which each of the transfer signals TRX(A) and TRX(B), the select signal SEL, and the reset signal RST is transmitted corresponds to the pixel drive interconnection 30 of FIG. 2.

The phase difference pixel 22Y may be configured in the above manner, but is not limited to this configuration and may employ other configurations.

For example, the example of FIG. 4 has a configuration in which the charges generated by the photodiodes PD(A) and PD(B) are transferred to the same FD 62 and are outputted to the column signal processing circuit 25 via the vertical signal lime. 29. However, also a configuration in which the FD 62, the reset transistor 63, the amplifying transistor 64, and the select transistor 65 are provided separately to correspond to each of the photodiodes PD(A) and PD(B) and the signal charges of the photodiodes PD(A) and PD(B) are outputted simultaneously to the column signal processing circuit 25 is possible.

<Relationship Between the Image Height and the Principal Ray>

Next, the relationship between the image height and the principal ray of the solid state imaging device 13 is described with reference to FIG. 5.

Figure 5:
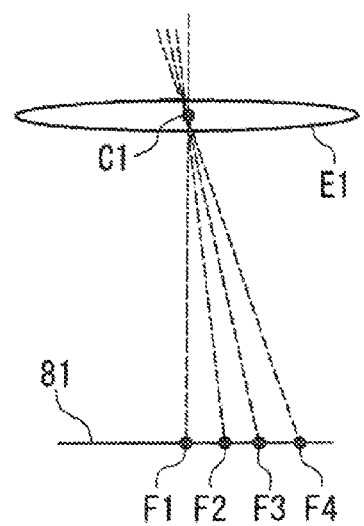
FIG. 5 is a diagram describing the relationship between the image height and the principal ray of the solid state imaging device.

In FIG. 5, the exit pupil E1 formed by the optical system 11 of the imaging apparatus 1 and the light receiving surface 81 of the pixel array unit 23 of the solid state imaging device 13 are shown.

In addition, in FIG. 5, prescribed positions F1 to F4 in the light receiving surface 81 and the principal rays for the positions F1 to F4 (four broken lines passing through the center C1) are shown.

The position F1 is a position in the light receiving surface 81 through which a principal ray parallel to the optical axis of the exit pupil E1 (the angle being 0°) passes. The position F2 is a position through which a principal ray oblique to the optical, axis by approximately 5° passes, the position F3 is a position through which a principal ray oblique to the optical axis by approximately 10° passes, and the position F4 is a position through which a principal, ray oblique to the optical axis by approximately 15° passes. Here, the optical axis is a straight line representing the light flux passing through the entire optical system 11, and refers to an axis connecting the centers of the optical system 11.

Thus, the angle of the principal ray incident on each pixel 22 in the pixel array unit 23 varies in accordance, with the image height in the pixel array unit 23 (the distance from the optical axis on the light receiving surface 81). More specifically, as the image height increases, the angle of the principal ray increases. The principal ray is a light ray passing through the center C1 of the exit pupil E1; therefore, in order to perform the detection of phase difference with good accuracy, it is necessary to make coincide the center position between the photodiodes PD(A) and PD(B) of the phase difference pixel 22Y and the imaging point of the principal ray (the center of the imaging point of the subject light that has passed through tine microlens 47).

<Relationship Between the Image Height and the Photodiodes PD(A) and PD(B)>

Figure 6:
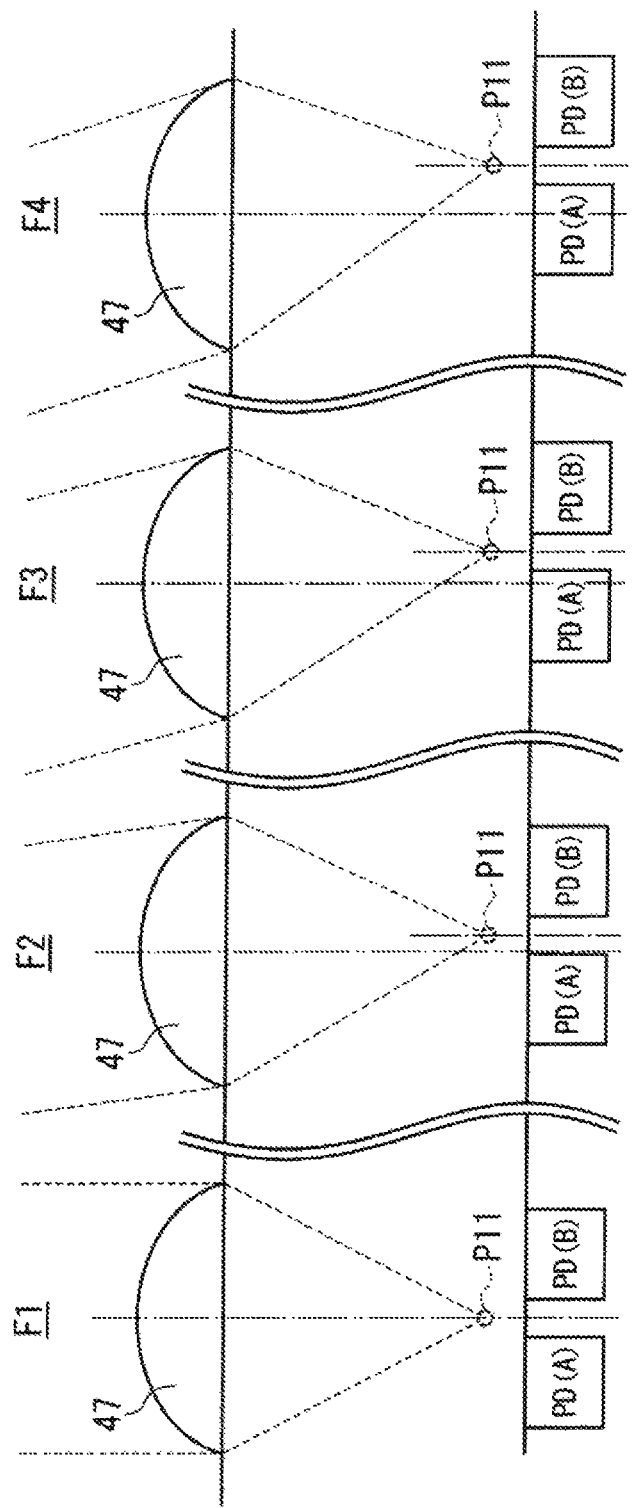
FIG. 6 is a diagram describing the relationship between the image height and the photodiode.

Hence, in the solid state imaging device 13, as shown in FIG. 6, the center position between the photodiodes PD(A) and PD(B) of the phase difference pixel 22Y is disposed to coincide with the imaging point P11 of the principal ray incident on the microlens 47.

FIG. 6 is a diagram showing the relationship between the positions F1 to F4 in the light receiving surface 81 of the pixel array unit 23 and the arrangement of the photodiodes PD(A) and PD(B) of the phase difference pixel 22Y.

In FIG. 6, the phase difference pixel 22Y in the position F1 in the pixel array unit 23, which passes through the center of the optical system 11 (optical axis), is shown on the leftmost side, and the phase difference pixels 22Y in the positions F2 to F4 are shown in this order rightward.

In FIG. 6, the illustration of the configuration other than the photodiodes PD(A) and PD(B) and the microlens 47 in the configuration of the phase difference pixel 22Y is omitted.

In FIG. 6, of the principal ray incident on each microlens 47, the light rays passing through the left end and the right end of the microlens 47 are shown by the broken line. The principal ray incident on the microlens 47 is, concentrated to the imaging point P11 (the principal ray imaging point P11).

In FIG. 6, the center of the microlens 47 is shown by the alternate long and two short, dashes line, and the center position between the photodiodes PD(A) and PD(B) of the phase difference pixel 22Y is shown by the alternate long and short dash line.

In the pixel array unit 23 of the solid state imaging device 13, in order for the photodiodes PD(A) and PD(B) to receive the light collected by the microlens 47 fully, the center position of the microlens 47 is disposed to shift toward the center side of the pixel array unit 23 as the image height increases.

The center position between the photodiodes PD(A) and PD(B) of the phase difference pixel 22Y is disposed at the position of the imaging point P11 of the principal ray incident on the microlens 47.

However, the arrangement of the photodiodes PD(A) and PD(B) shown in FIG. 6 is not a structure of being arranged optimally against vignetting. The vignetting refers to a phenomenon in which light rays incident on the peripheral portion of the pixel array unit 23 do not pass through the whole effective aperture diameter (aperture stop diameter), but are blocked by the edge of the lens, the frame, etc. existing in the front, and rear of the aperture stop and consequently the light quantities of pixels 22 in the peripheral portion of the pixel array unit 23 are reduced, Therefore, in the arrangement, of the photodiodes PD(A) and PD(B) shown in FIG. 6, it is presumed that the accuracy of phase difference detection will be reduced due to the influence of vignetting.

<3. With Regard to the Influence of Vignetting on Phase Difference Detection>

In this regard, the influence of vignetting on phase difference detection will now be described with reference to FIG. 7 and FIG. 8.

Figure 7:
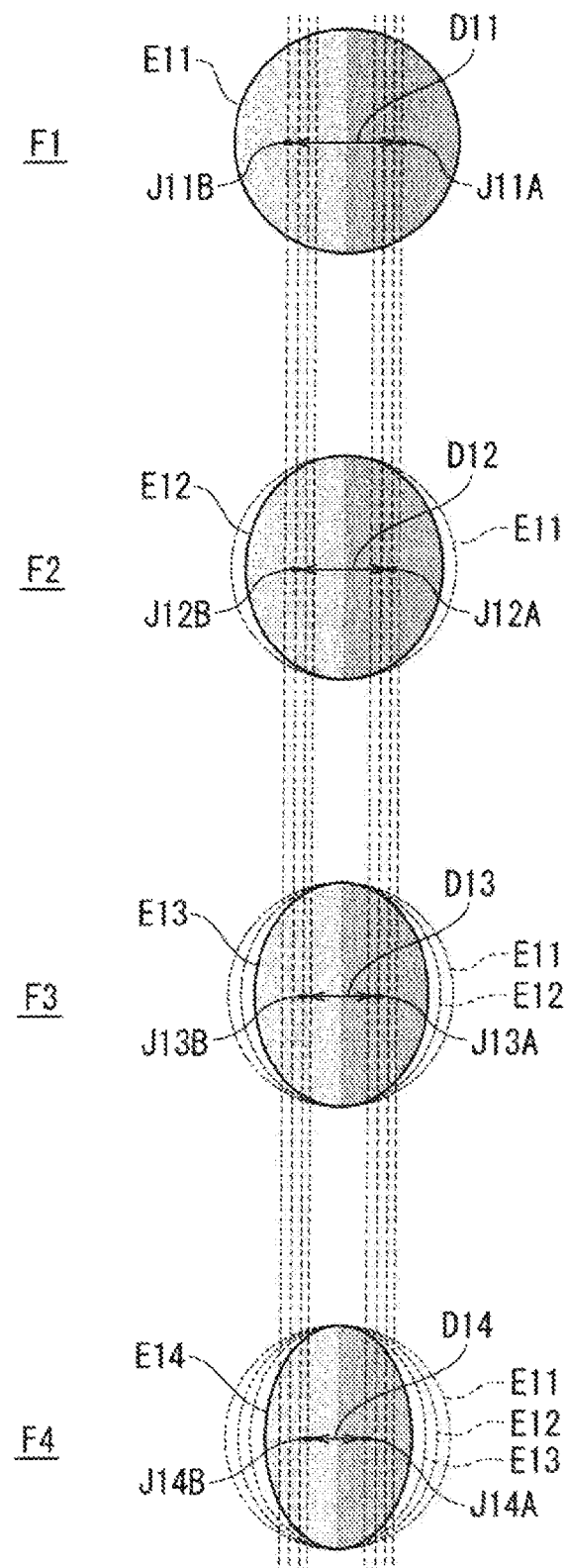
FIG. 7 is a diagram describing the relationship between the image height and the photodiode.

FIG. 7 is a schematic diagram of exit pupils illustrating the influence of vignetting.

In FIG. 7, the exit pupils E11 to E14 in the positions F1 to F4 in FIG. 5 in which vignetting has occurred are shown.

The exit pupil E11 in the pixel 22 of the position F1 of the light receiving surface 81 is in a shape identical to the shape of the lens (circular shape) because vignetting does not occur.

In contrast, as the position in the light receiving surface 81 transitions from the central portion toward the peripheral portion of the pixel array unit 23 like the positions F2 to F4, the subject light that has passed through the lens and is incident on the pixel 22 becomes snore likely to be blocked (vignetted) by the edge of the lens, the frame, etc. existing in the front and rear of the aperture stop. Consequently, the shapes of the exit pupils E12 to E14 of the positions F2 to F4 change from a circular shape to an elliptical, shape with transition from the central portion toward the peripheral portion of the pixel array unit 23.

In FIG. 7, in the case where the pixel 22 is the phase difference pixel 22Y, the regions through which the subject lights received by the photodiodes PD(A) and PD(B) pass are shown with different concentrations.

Specifically, in the exit pupils E11 to E14, the right region marked with a thick concentration (high concentration) indicates a region through which the subject light received by the photodiode PD(A) on the left side of the phase difference pixel 22Y passes, and the left region marked with a thin concentration (low concentration) indicates a region through which the subject light received by the photodiode PD(B) on the right side of the phase difference pixel 22Y passes.

Positions J11A to J14A indicate the centroid position of the high concentration region through which the subject light received by the photodiode PD(A) passes in the exit pupils E11 to E14, and positions J11B to J14B indicate the centroid position of the low concentration region through which the subject light received by the photodiode PD(B) passes.

In the exit pupils E11 to E14, the distance between the centroid positions of the subject light passage regions of the photodiode PD(A) and the photodiode PD(B) indicates phase difference detection characteristics of the phase difference pixel 22Y. The phase difference detection characteristics are the accuracy in detecting phase difference on the basis of the signals of the phase difference pixel 22Y; and when the degree (accuracy) of separation of subject light is increased, the measurement of the shift amount of the image can be performed finely, and the accuracy of phase difference detection is improved. Thus, the larger the distance between the centroid positions of the subject light passage regions of the photodiode PD(A) and the photodiode PD(B) is, the higher the accuracy of phase difference detection is.

As shown in FIG. 7, the distances D11 to D14, between the centroid positions of the subject light passage regions of the photodiode PD(A) and the photodiode PD(B) in the exit pupils E11 to E14 become shorter with transition from the central portion toward the peripheral portion of the pixel array unit 23.

Figure 8:
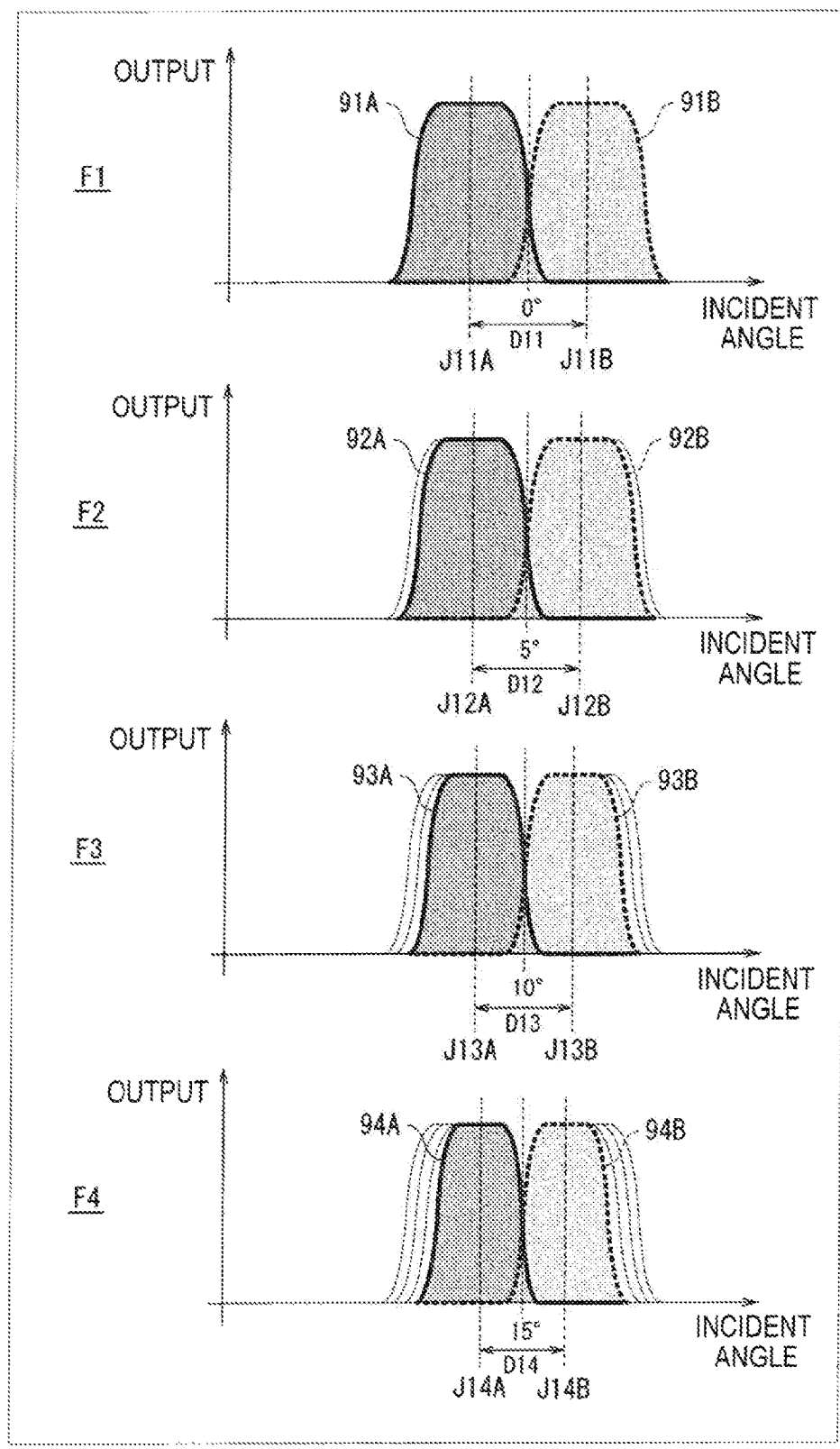
FIG. 8 is a diagram describing the influence of vignetting on phase difference detection.

FIG. 8 shows the light receiving characteristic distribution of each of the photodiodes PD(A) and PD(B) in the positions F2 to F4 in the light receiving surface 81.

The light receiving angle distribution is shown by defining the horizontal axis as an axis representing the incident angle of the light incident on the microlens 47 and the vertical axis as an axis representing the output (signal intensity) of the signal produced by the photodiode PD(A) or PD(B). Here, for the incident angle, it is assumed that light rays parallel to the optical axis of the microlens 47 are at "0°," and light rays traveling from the upper left toward the lower right in the pixel division direction (for the photodiodes PD(A) and PD(B), the leftward and rightward directions) are at plus-side angles.

A light receiving angle distribution 91A shows the light receiving angle distribution of the photodiode PD(A) in the position F1 of the light receiving surface 81, and a light receiving angle distribution 91B shows the light receiving angle distribution of the photodiode PD(B) in the position F1 of the light receiving surface 81. The average values of the light receiving angle distributions 91A and 91B correspond to the centroid positions J11A and J11B of FIG. 7, respectively.

A light receiving angle distribution 92A shows the light receiving angle distribution of the photodiode PD(A) in the position F2 of the light receiving surface 81, and a light receiving angle distribution 92B shows the light receiving angle distribution of the photodiode PD(B) in the position F2 of the light receiving surface 81. The average values of the light receiving angle distributions 92A and 92B correspond to the centroid positions J12A and J12B of FIG. 7, respectively.

A light receiving angle distribution 93A shows the light receiving angle distribution, of the photodiode PD(A) in the position F3 of the light receiving surface 81, and a light receiving angle distribution 93B shows the light receiving angle distribution of the photodiode PD(B) in the position F3 of the light receiving surface 81. The average values of the light receiving angle distributions 93A and 93B correspond to the centroid positions J13A and J13B of FIG. 7, respectively.

A light receiving angle distribution 94A shows the light receiving angle distribution of the photodiode PD(A) in the position F4 of the light receiving surface 81, and a light receiving angle distribution 94B shows the light receiving angle distribution of the photodiode PD(B) in the position F4 of the light receiving surface 81. The average values of the light receiving angle distributions 94A and 94B correspond to the centroid positions J14A and J14B of FIG. 7, respectively.

As shown in FIG. 7, when vignetting has occurred, the exit pupil E11 to the exit pupil E14 become smaller in accordance with the increase in image height. That is, the range of angle of the subject light incident on the phase difference pixel 22Y decreases, with transition from the central portion toward the peripheral portion of the pixel array unit 23. For example, for the photodiode PD(A), the subject light on the side of smaller incident angles is not received as shown, in the light receiving angle distributions 91A to 94A. For the photodiode PD(B), the subject light on the side of larger incident angles is not received as shown in the light receiving angle distributions 91B to 94B. That is, when vignetting occurs, the subject light at angles far from the angle of the principal ray (optical axis center position) is not received.

When the subject light at angles far from the angle of the principal ray is not received due to vignetting, as described with reference to FIG. 7, the centroid positions (J11A to J14A and J11B to J14B) of the subject light received by the phase difference pixel 22Y shift toward the side of the angle of the principal ray. Accordingly, the distance between the centroids (D11 to D14) becomes shorter; thus, the phase difference detection characteristics vary with the position (central portion, peripheral portion, etc.) in the pixel array unit 23.

Thus, if the influence of vignetting is not taken into consideration, the phase difference detection characteristics vary with the position (central portion, peripheral portion, etc.) in the pix el, array unit 23, and therefore the accuracy of phase difference detection is not good.

<4. First Embodiment of the Phase Difference Pixel>
<Arrangement Example of the Photodiodes PD(A) and PD(B) of the First Embodiment>

Figure 9:
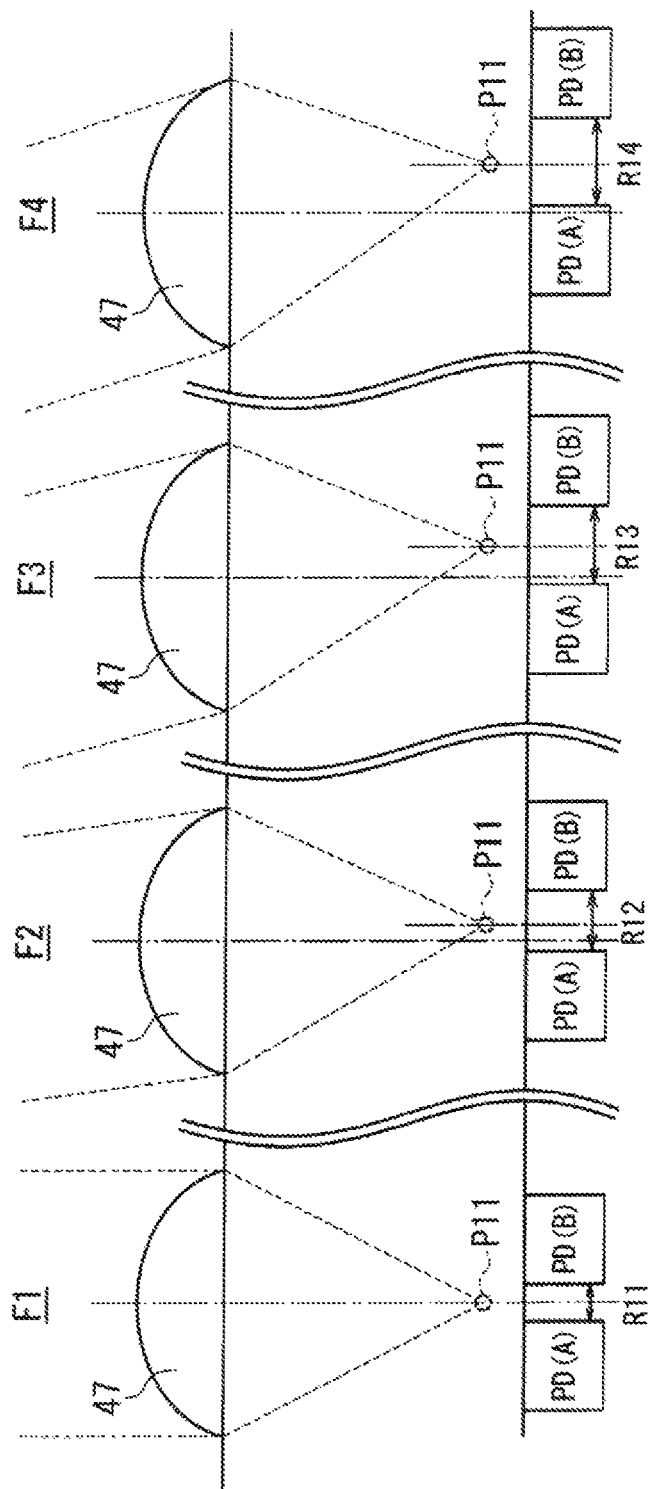
FIG. 9 is a diagram showing an arrangement example of photodiodes of a first embodiment.

Hence, in the solid state imaging device 13 of a first embodiment, in order to suppress the influence of vignetting, the photodiodes FD(A) and PD(B) of the phase difference pixel 22Y are formed as shown in FIG. 9, not in the arrangement shown in FIG. 6, in the positions F1 to F4 in the light receiving surface 81 of the pixel array unit 23.

FIG. 9 is a diagram showing the relationship between the positions F1 to F4 in the light receiving surface 81 of the pixel array unit 23 in the solid state imaging device 13 of the first embodiment and the arrangement of the photodiodes PD(A) and PD(B) of the phase difference pixel 22Y.

In the solid state imaging device 13 of the first embodiment, as shown in FIG. 9, the distances R11 to R14 between the photodiodes PD(A) and PD(B) increase as the position in the light receiving surface 81 transitions in the order of the positions F1, F2, F3, and F4, that is, the pixel position transitions from the central portion toward, the peripheral portion of the pixel array unit 23. In other words, as the pixel position transitions from the central portion toward the peripheral portion of the pixel array unit 23, the photodiodes PD(A) and PD(B) are formed in positions farther from the optical axis center.

Figure 10:
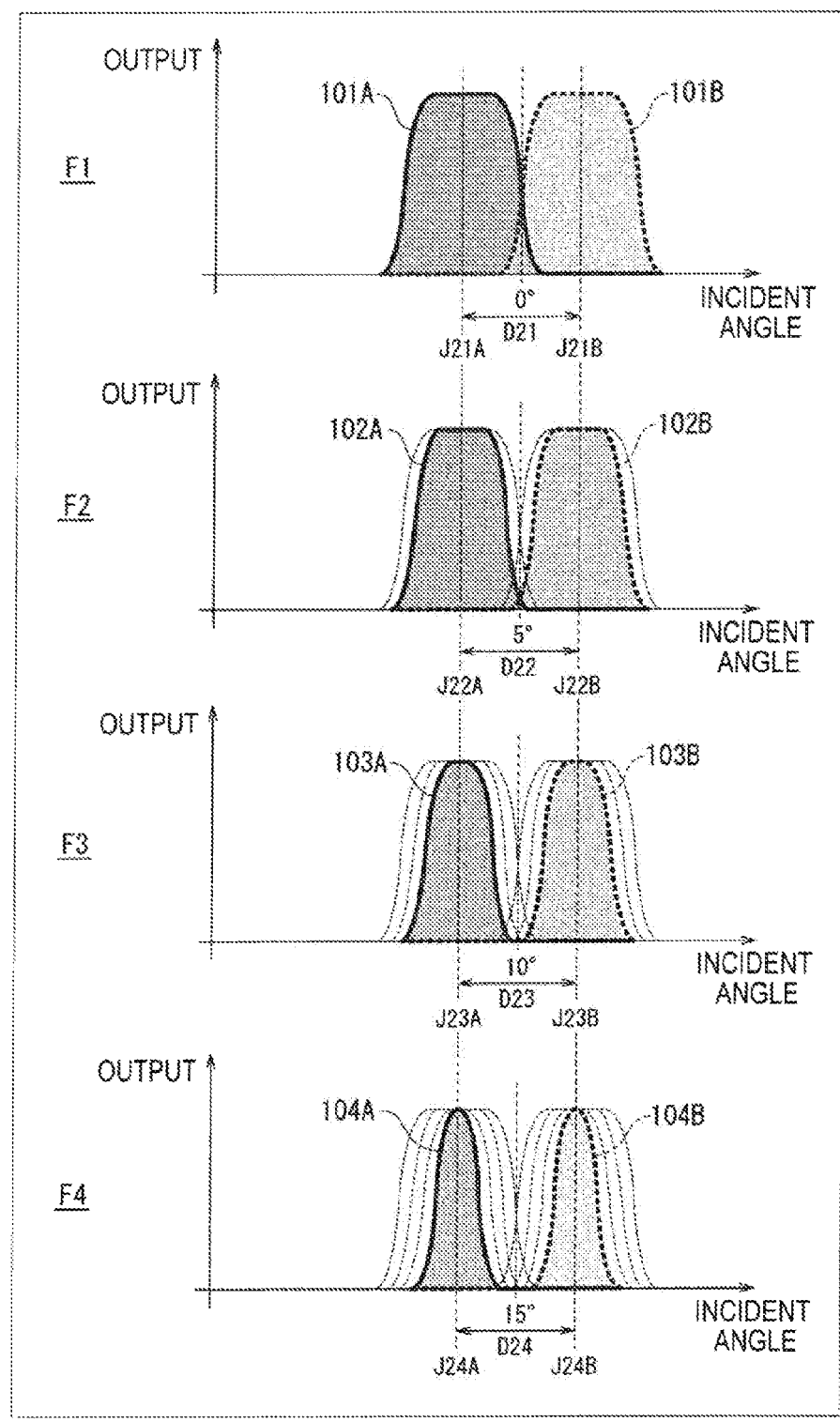
FIG. 10 is a diagram describing effects of the first embodiment of the phase difference pixel.

FIG. 10 shows the light receiving angle distribution of each of the photodiodes PD(A) and PD(B) shown in FIG. 9.

A light receiving angle distribution 101A shows the light receiving angle distribution of the photodiode PD(A) in the position F1 of the light receiving surface 81, and a light receiving angle distribution 101B shows the light receiving angle distribution of the photodiode PD(B) in the position F1 of the light receiving surface 81.

A light receiving angle distribution 102A shows the light receiving angle distribution of the photodiode PD(A) in the position F2 of the light receiving surface 81, and a light receiving angle distribution 102B shows the light receiving angle distribution of the photodiode PD(B) in the position F2 of the light receiving surface 81.

A light receiving angle distribution 103A shows the light receiving angle distribution of the photodiode PD(A) in the position F3 of the light receiving surface 81, and a light receiving angle distribution 103B shows the light receiving angle distribution of the photodiode PD(B) in the position F3 of the light receiving surface 81.

A light receiving angle distribution 104A shows, the light receiving angle distribution of the photodiode PD(A) in the position F4 of the light receiving surface 81, and a light receiving angle distribution 104B shows the light receiving angle distribution of the photodiode PD(B) in the position F4 of the light receiving surface 81.

By the photodiodes PD(A) and PD(B) being formed in positions farther from the optical axis center as the pixel position transitions from the central portion toward the peripheral portion of the pixel array unit 23, the subject light at angles close to the angle of the principal ray becomes less likely to be received. Furthermore, as the distances R11 to R14 between the photodiodes PD(A) and PD(B) shown is FIG. 9 increase, the quantity of unreceived subject light at angles close to the angle of the principal ray increases.

Consequently, the centroid positions J21A to J24A of the light receiving angle distributions 101A to 104A of the photodiode PD(A) become the same position, and the centroid positions J21B to J24B of the light receiving angle distributions 101B to 104B of the photodiode PD(B) become the same position.

In other words, the distances R11 to R14 between the photodiodes PD(A) and PD(B) of FIG. 9 are determined and arranged so that the centroid positions J21A to J24A are the same position and the centroid positions J21B to J24B are the same position.

Accordingly, also the distances D21 to D24 between the centroids in the positions F1 to F4 in the light receiving surface 81 of the pixel array unit 23 become the same.

Therefore, by the solid state imaging device 13 of the first embodiment, the phase difference detection characteristics can be made uniform regardless of the image height. In other words, by the solid state imaging device 13 of the first embodiment, the phase difference detection characteristics do not vary with the position (central portion, peripheral, portion, etc.) in the pixel array unit 23, and therefore the degradation of the accuracy of phase difference detection can be suppressed.

<Other Structure Examples of the Phase Difference Pixel 22Y of the First Embodiment>

Next, other structure, examples of the phase difference pixel 22Y of the first embodiment are described.

Figure 11:
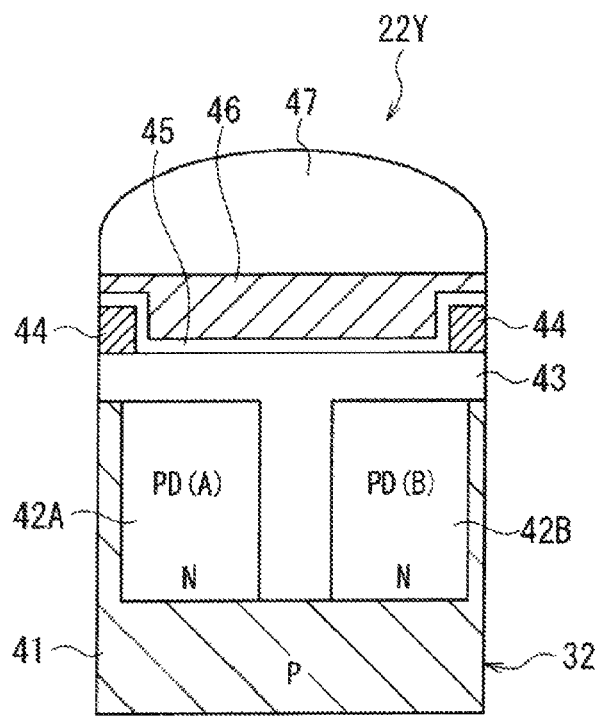
FIG. 11 is a diagram showing another structure example of the first embodiment of the phase difference pixel.
Figure 12:
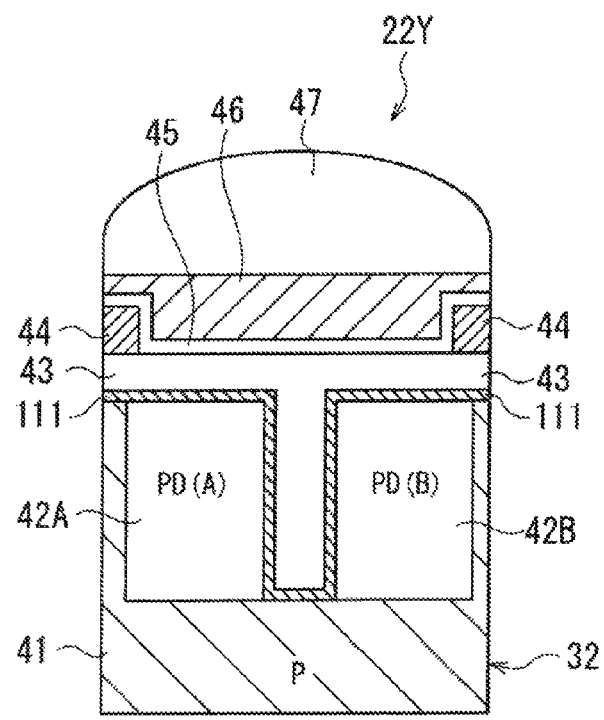
FIG. 12 is a diagram showing another structure example of the first embodiment of the phase difference pixel.

FIG. 11 shows a first modification example of the phase difference pixel 22Y of the first embodiment, and FIG. 12 shows a second modification example of the phase difference pixel 22Y.

In FIG. 3, the portion between the N-type semiconductor regions 42A and 42B that form the photodiodes PD(A) and PD(B) is made the P-type semiconductor region 41 of the semiconductor substrate 32.

However, for example, also a structure in which, as shown in FIG. 11, the P-type semiconductor region 41 between the N-type semiconductor regions 42A and 42B is dug in the depth direction and embedded with the anti-reflection film, (insulating layer) 43, which has been formed on the upper side of the N-type semiconductor regions 42A and 42B, is possible.

Furthermore, as shown in FIG. 12, in a trench structure in which the anti-reflection film 43 is embedded between the N-type semiconductor regions 42A and 42B, a pinning layer 111 may be further formed using, for example, hafnium oxide ($HfO_2$), tantalum oxide ($Ta_2O_5$), or the like between the anti-reflection film 43 and the N-type semiconductor regions 42A and 42B. The pinning layer 111 is formed using a high, dielectric material having a negative fixed charge, and has an effect in which a positive charge (hole) storage region is formed arid the occurrence of a dark current is suppressed.

Although structure examples of the phase difference pixel 22Y in the-central portion of the pixel array unit 23 corresponding to the position F1 of FIG. 9 are shown in FIG. 11 and FIG. 12, in the first embodiment the distance between the N-type semiconductor regions 42A and 42B increases as the pixel position transitions toward the peripheral portion of the pixel array unit 23, as described above. In this case, the trench dug between the N-type semiconductor regions 42A and 42B may be formed in the same region, or may be formed larger in accordance with the distance between the N-type semiconductor regions 42A and 42B.

Figure 13:
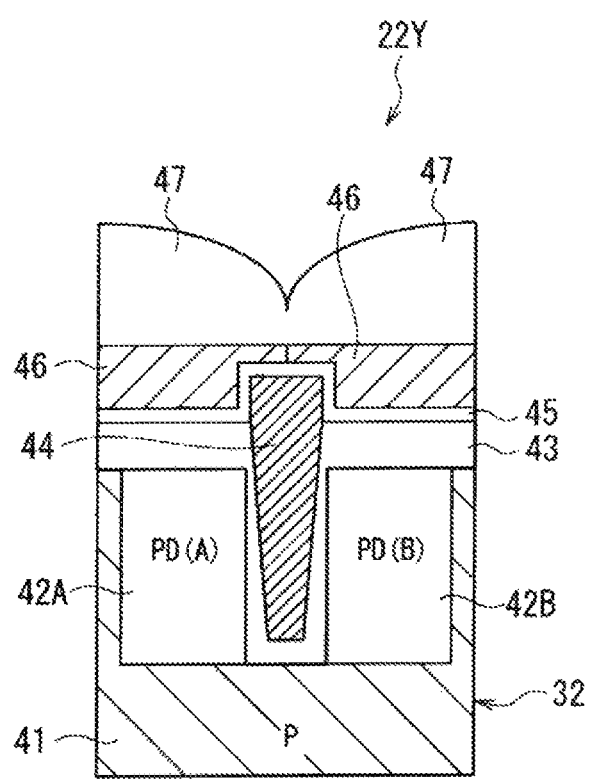
FIG. 13 is a diagram showing another structure example of the first embodiment of the phase difference pixel.

In the peripheral portion of the pixel array unit 23, in a region where the position of the trench dug between the N-type semiconductor regions 42A and 42B and the position of the light blocking film 44 overlap, the light blocking film 44 may be formed to be dug in the semiconductor substrate 32 as shown in FIG. 13.

<5. Second Embodiment of the Phase Difference Pixel>

A second embodiment of the phase difference pixel 22Y capable of suppressing the influence of vignetting will now be described.

In the second embodiment, unlike the first embodiment, the distance between the photodiodes PD(A) and PD(B) is invariant regardless of the positions F1 to F4 in the light receiving surface 81 of the pixel array unit 23, as shown in FIG. 6.

However, is the second embodiment, the drain voltage of the reset transistor 63 of each phase difference pixel 22Y is set to become lower with transition from the central portion toward the peripheral portion of the pixel array unit 23.

Figure 14:
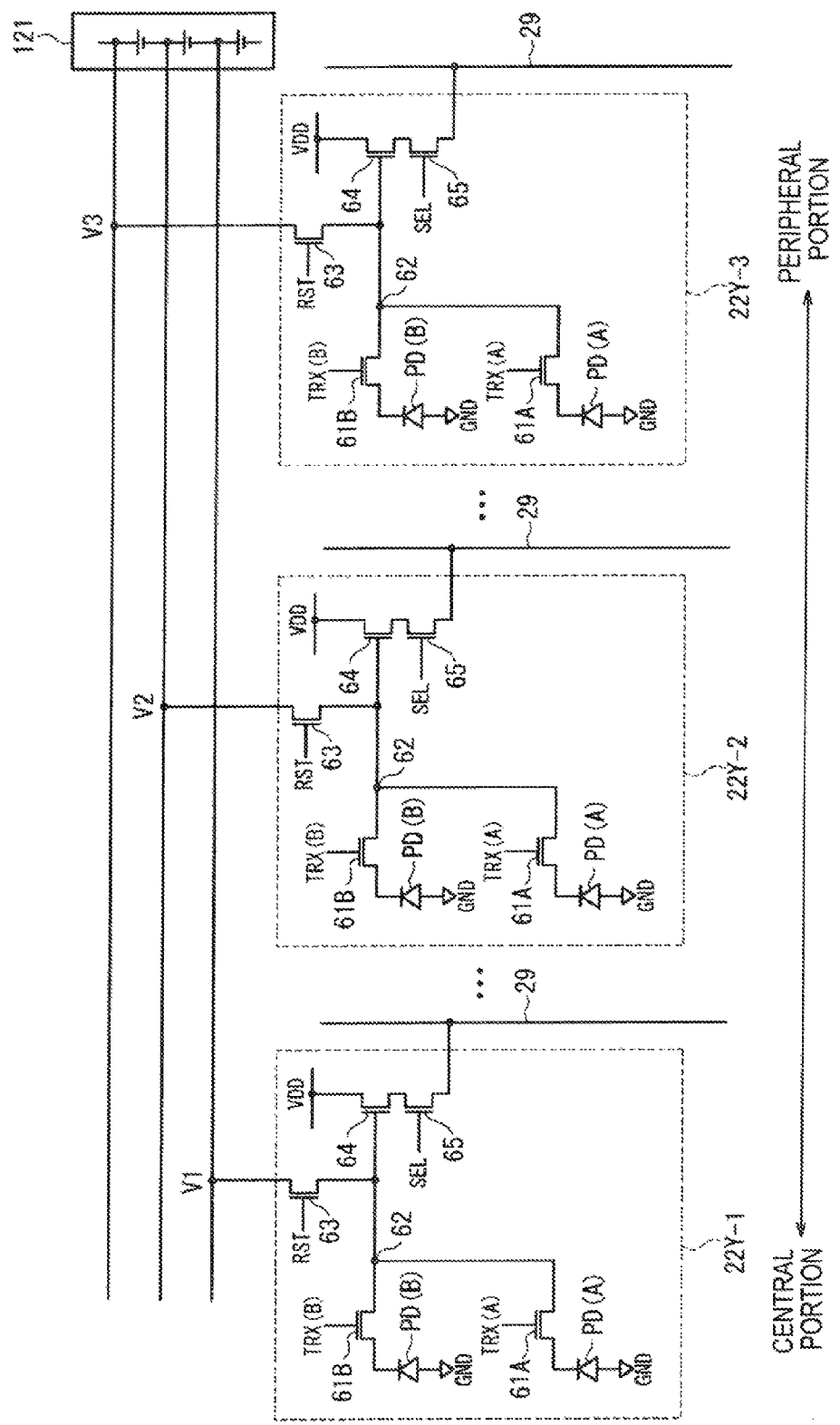
FIG. 14 is a diagram showing a second embodiment of the phase difference pixel.

FIG. 14 shows a pixel circuit of a plurality of phase difference pixels 22Y (phase difference pixels 22Y-1 to 22Y-3) disposed in a prescribed pixel row in the pixel array unit 23.

The phase difference pixels 22Y-1 to 22Y-3 shown in FIG. 14 are disposed to sandwich a prescribed number of imaging pixels 22X in the pixel array unit 23, for example.

A reset voltage V1 is supplied from a multi-voltage power source 121 to the reset, transistor 63 of the phase difference pixel 22Y-1 in the central portion in the pixel array unit 23.

A reset voltage V2 that is lower than the reset voltage V1 is supplied from the multi-voltage power source 121 to the reset transistor 63 of the phase difference pixel 22Y-2 that is closer to the peripheral portion than the phase difference pixel 22Y-1 is.

A reset voltage V3 that is lower than the reset voltage V2 is supplied from the multi-voltage power source 121 to the reset transistor 63 of the phase difference pixel 22Y-3 that is still closer to the peripheral portion than the phase difference pixel 22Y-2 is (V1>V2>V3).

Figure 15:
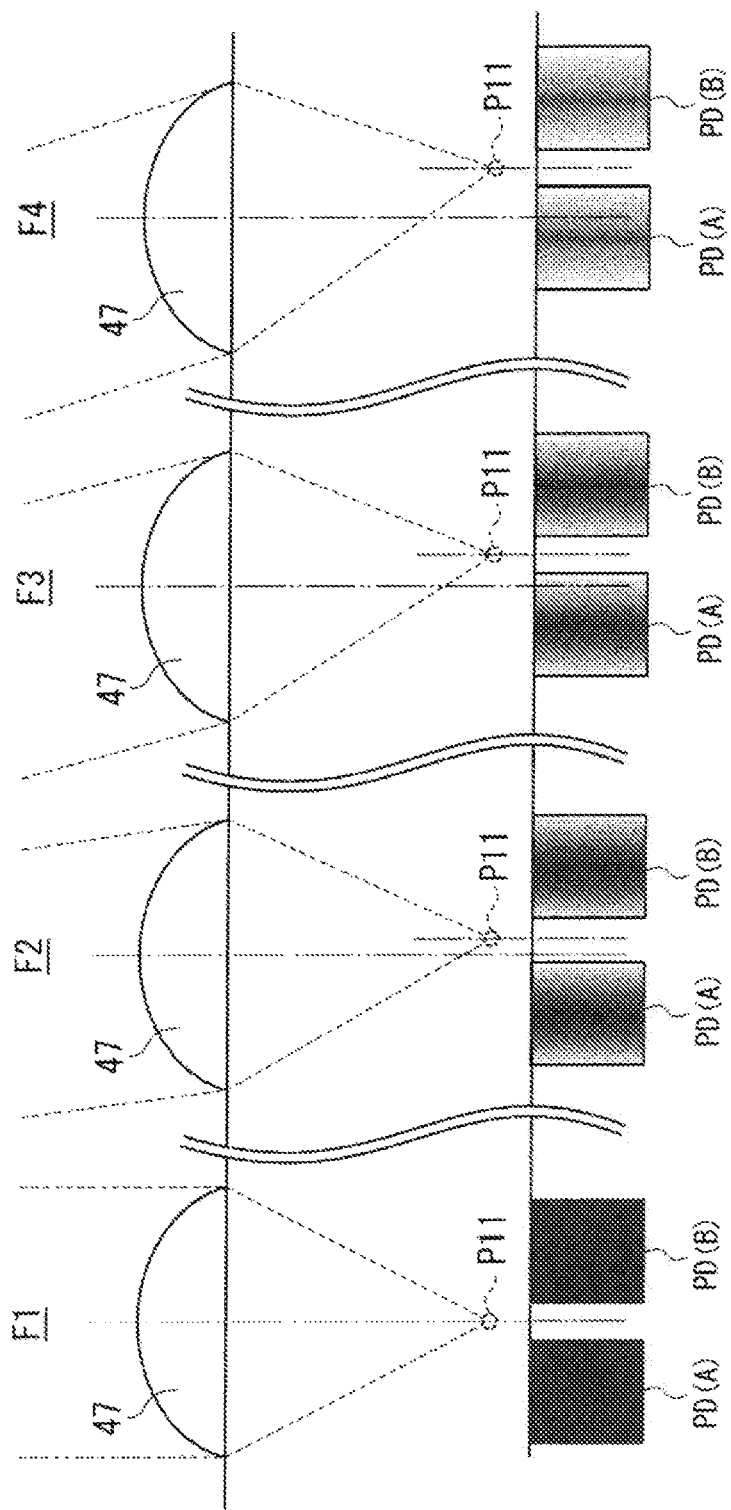
FIG. 15 is a diagram describing effects of the second embodiment of the phase difference pixel.

FIG. 15 is a diagram showing, with gradation, the depleted regions of the photodiode PD(A) and the photodiode PD(B) which are formed by the reset voltage (drain voltage) of the reset transistor 63 of each phase difference pixel 22Y being set to become lower with transition from the central portion toward the peripheral portion of the pixel array unit 23.

As described with reference to FIG. 3, the concentration gradient of the P-N junction on the inside (pixel center side) of the photodiodes PD(A) and PD(B) is formed so as to be gentler than the concentration gradient of the P-N junction on the outside (pixel boundary side) of the photodiodes PD(A) and PD(B). Thus, the voltage dependence of the reset voltage is larger at the P-N junction on the inside of the photodiodes PD(A) and PD(B), and the voltage dependence of the reset voltage is smaller at the P-N junction on the outside of the photodiodes PD(A) and PD(B).

As shown in FIG. 15, the depleted regions of the photodiode PD(A) and the photodiode PD(B) become smaller in accordance with the reset voltage; thereby, the distance between the centroid positions of the subject light passage regions of the photodiode PD(A) and the photodiode PD(B) increases with transition from the central portion toward the peripheral portion of the pixel array unit 23.

Consequently, similarly to FIG. 10, the centroid positions J21A to J24A of the light receiving angle distributions 101A to 104A of the photodiode PD(A) in the positions F1 to F4 become the same position, and the centroid positions J21B to J24B of the light receiving angle distributions 101B to 104B of the photodiode PD(B) in the positions F1 to F4 become the same position.

Accordingly, also the distances D21 to D24 between the centroids in the positions F1 to F4 in the light, receiving surface 81 of the pixel array unit 23 become the same.

Therefore, by the solid state imaging device 13 of the second embodiment, the phase difference detection characteristics can be made uniform regardless of the image height, to other words, by the solid state imaging device 13 of the second, embodiment, the phase difference detection characteristics do not vary with the position (central portion, peripheral portion, etc.) in the pixel array unit 23, and therefore the degradation of the accuracy of phase difference detection can be suppressed.

The phase difference detection characteristics can be made uniform regardless of the image height also by a configuration in which the phase difference pixels 22Y of the first embodiment and the second embodiment are combined. That is, as the pixel position transitions from the central portion toward, the peripheral portion of the pixel array unit 23, the photodiode PD(A) and the photodiode PD(B) may be formed in positions farther from the optical axis center and the reset voltage may be set to become lower; thereby, the distances D21 to D24 between the centroids in the positions F1 to F4 in the light receiving surface 81 of the pixel array unit 23 can be made the same.

<6. Example of Application to a CCD>

The examples described above are described using the configuration of a CMOS solid state imaging device as the solid state imaging device 13 of the imaging apparatus 1 of FIG. 1.

However, the technology of the present disclosure can be applied also to CCD solid state imaging devices.

Figure 16:
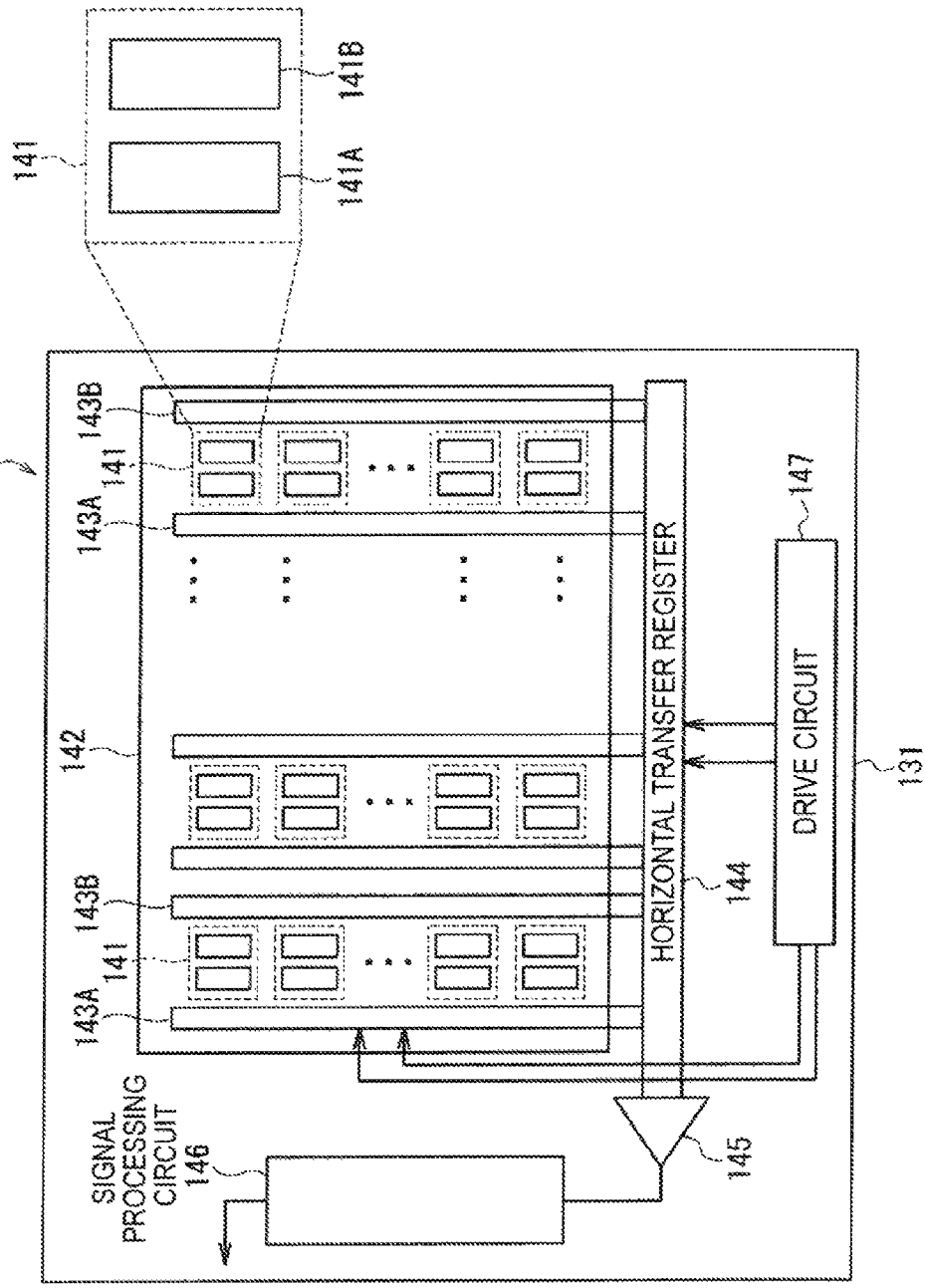
FIG. 16 is a diagram showing an example of application to a CCD solid state imaging device.

FIG. 16 is a diagram showing a rough configuration in the case where the solid state imaging device 13 is a CCD solid state imaging device.

The solid state imaging device 13 of FIG. 16 includes a pixel array unit 142 in which a plurality of pixels 141 are two-dimensionally arranged in a matrix configuration on a semiconductor substrate 131 using, for example, silicon (Si) as a semiconductor.

Each of the pixels 141 two-dimensionally arranged includes a photodiode as a photoelectric conversion element that performs photoelectric conversion, and converts the incident light to a signal charge in accordance with the received light quantity and stores the signal charge. Each of the pixels 141 includes a plurality of pixel transistors for reading the signal charge stored in the photodiode. The plurality of pixel transistors include, for example, a charge read transistor, a reset transistor, an amplifying transistor, a select transistor, etc.

In each of the pixels 141, for example, similarly to the phase difference pixel 22Y of FIG. 3, two N-type semiconductor regions are formed in a P-type semiconductor region that is the semiconductor substrate 131; thus, two photodiodes 141A and 141B are formed.

Because of the formation positions being different, the two photodiodes 141A and 141B in the pixel 141 can be used as a phase difference pixel. Furthermore, they can be used also as an imaging pixel by adding up the pixel signals of the two photodiodes 141A and 141B in the pixel 141.

By having either configuration of the first embodiment and the second embodiment described above, the two photodiodes 141A and 141B in the pixel 141 are configured such that the phase difference detection characteristics are uniform regardless of the image height.

More specifically, as described with reference to FIG. 9, the two photodiodes 141A and 141B are configured such that the distance between the two photodiodes 141A and 141V varies in accordance with the pixel position in the pixel array unit 142. Alternatively, the two photodiodes 141A and the 141B are configured such that the reset voltage supplied to the reset transistor in the pixel 141 varies in accordance with the pixel position in the pixel array unit 142.

In the pixel array unit 142, on both sides of a plurality of pixels 141 aligned in the column direction, two vertical transfer registers 143A and 143B are provided for each pixel column. Each of the two vertical transfer registers 143A and 143B is formed of a vertical CCD. The vertical transfer register 143A transfers the signal charge read from the photodiode 141A on the left side of the pixel 141 in the vertical direction, and the vertical transfer register 143B transfers the signal charge read from the photodiode 141B on the right side of the pixel 141 in the vertical direction.

A horizontal transfer register 144 is provided at the terminal ends of the vertical transfer registers 143A and 143B, along the horizontal direction. The horizontal transfer register 144 transfers the signal charge transferred in the vertical direction by each of the vertical transfer registers 143A and 143B in the horizontal direction, and is formed of a horizontal CCD. The transfer destination of the signal charge transferred by the horizontal transfer register 144 is provided with an output amplifier 145.

The output amplifier 145 converts the signal charge transferred in the horizontal direction by the horizontal transfer register 144 to a voltage and outputs the voltage. The signal outputted from the output amplifier 145 is inputted to a signal processing circuit 146. The signal processing circuit 146 takes in the signal outputted from the output amplifier 145 and performs signal processing established beforehand, and thereby produces a prescribed image signal. The produced image signal is outputted to the outside of the solid state imaging device 13.

A drive circuit 147 generates a transfer pulse for transferring the signal charge, and controls the driving of the vertical transfer registers 143A and 143B and the horizontal transfer register 144 in accordance with the transfer pulse. At this time, the drive circuit 147 supplies a vertical transfer pulse to the vertical transfer registers 143A and 143B, and supplies a horizontal transfer pulse to the horizontal transfer register 144.

The solid state imaging device 13 of FIG. 16 has the above rough configuration.

The solid state imaging device 13 of FIG. 16 is configured such that the phase difference detection characteristics of the two photodiodes 141A and 141B in the pixel 143 are uniform regardless of the image height. Thereby, the phase difference detection characteristics do not vary with the position (central portion, peripheral portion, etc.) in the pixel array unit 142, and therefore the degradation of the accuracy of phase difference detection can be suppressed.

<7. Other Application Examples>

In the embodiments described above, one microlens 47 is formed for one pixel.

Figure 17:
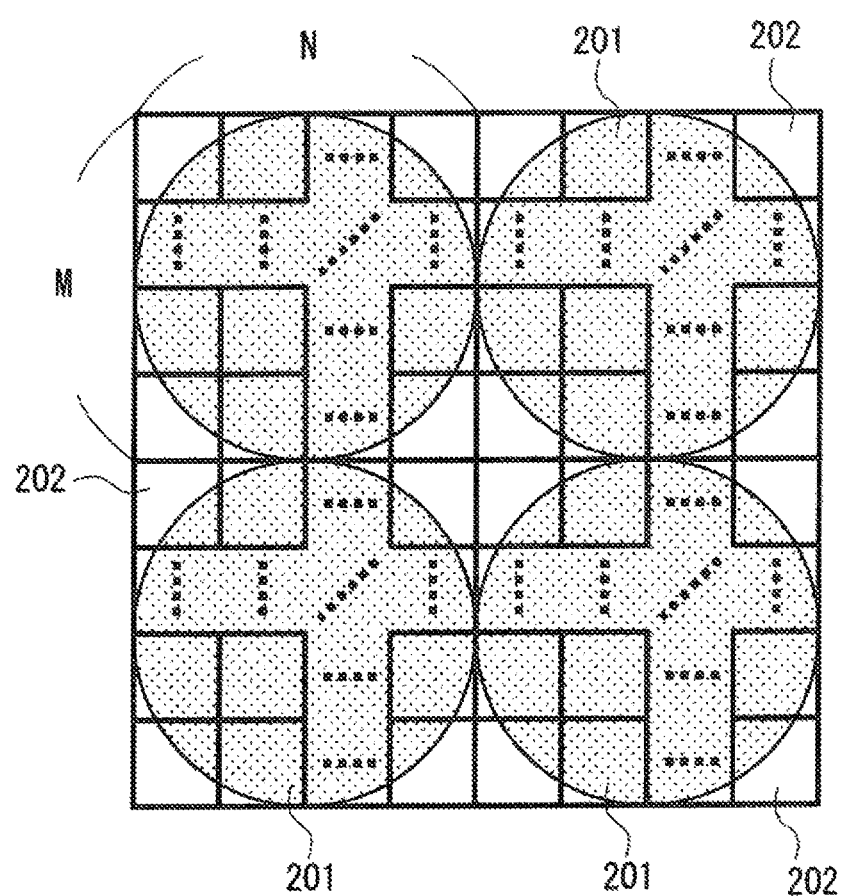
FIG. 17 is a diagram showing another configuration example of microlenses.

However, the solid state imaging device 13 may have a configuration in which, as shown in FIG. 17, one microlens 201 is shared among M×N (vertical direction×horizontal direction) pixels 202. Here, M and N are an integer of 1 or more, and at least one of M and N is a value larger than 1.

The technology of the present disclosure can be applied, also to the solid state imaging device 13 with a configuration in which one microlens 201 is shared among a plurality of pixels 202, as shown in FIG. 17.

Figure 18:
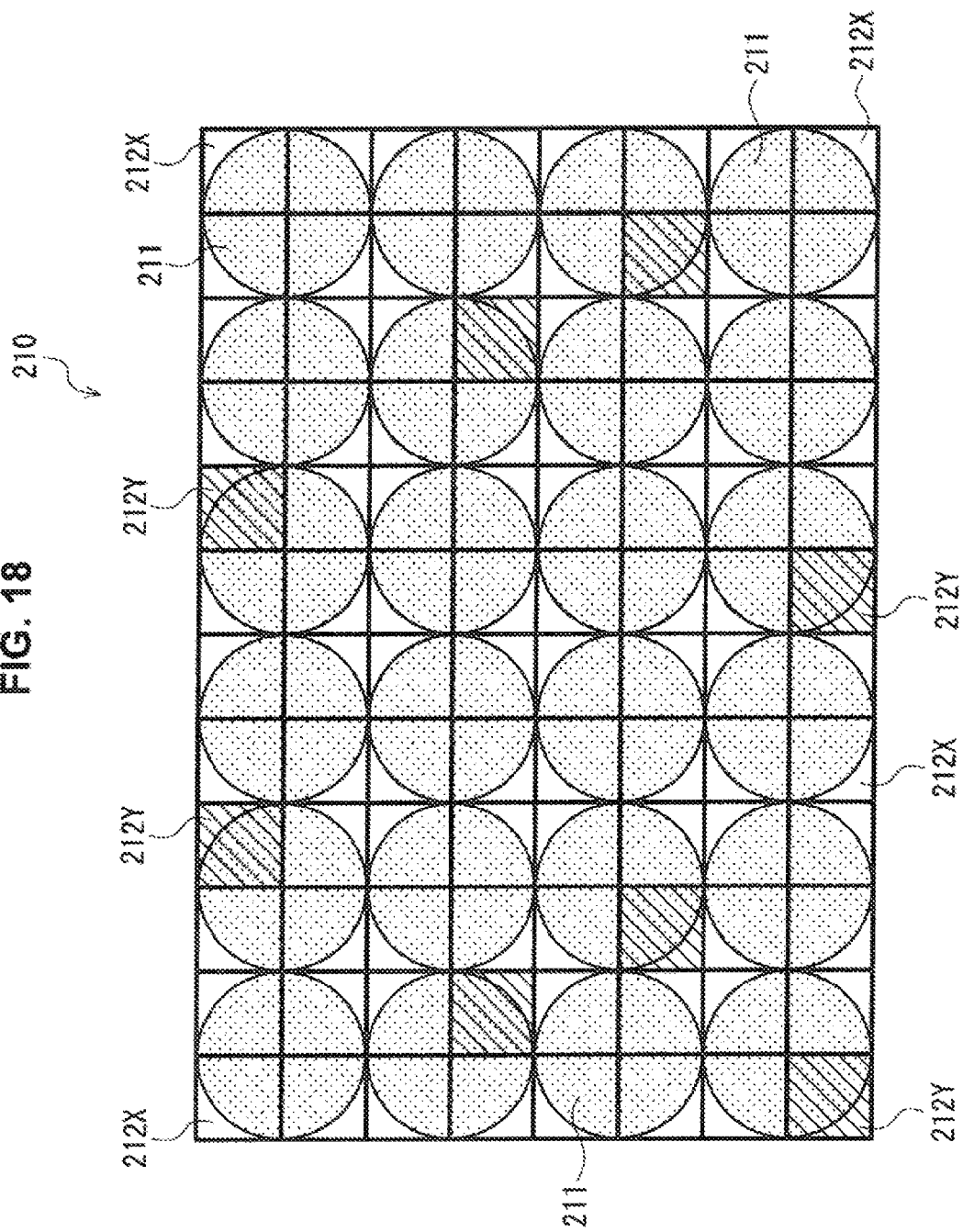
FIG. 18 is a diagram showing another configuration example of microlenses.

For example, FIG. 18 shows a configuration in which one microlens 211 is shared among four pixels 212.

In a pixel array unit 210, the pixels 212 two-dimensionally arranged in a matrix configuration include an imaging pixel 212X that produces a signal for image production and a phase difference pixel 212Y that produces a signal for focus detection. The phase difference pixel 212Y includes the two photodiodes PD(A) and PD(B) similarly to FIG. 3.

The two photodiodes PB(A) and PD(B) have either configuration of the first embodiment and the second embodiment, described above, and are thereby configured such that the phase difference detection characteristics are uniform regardless of the image height. Thereby, the phase difference detection characteristics do not vary with the position (central portion, peripheral portion, etc.) in the pixel array unit 210, and therefore the degradation of the accuracy of phase difference detection can be suppressed.

Such, a configuration in which one microlens 201 is shared among M×N pixels 202 can be applied also to the solid state imaging device 13 of a CCD type shown in FIG. 16 as a matter of course.

<Substrate Configuration Examples of the Solid State Imaging-Device>

Figure 19:
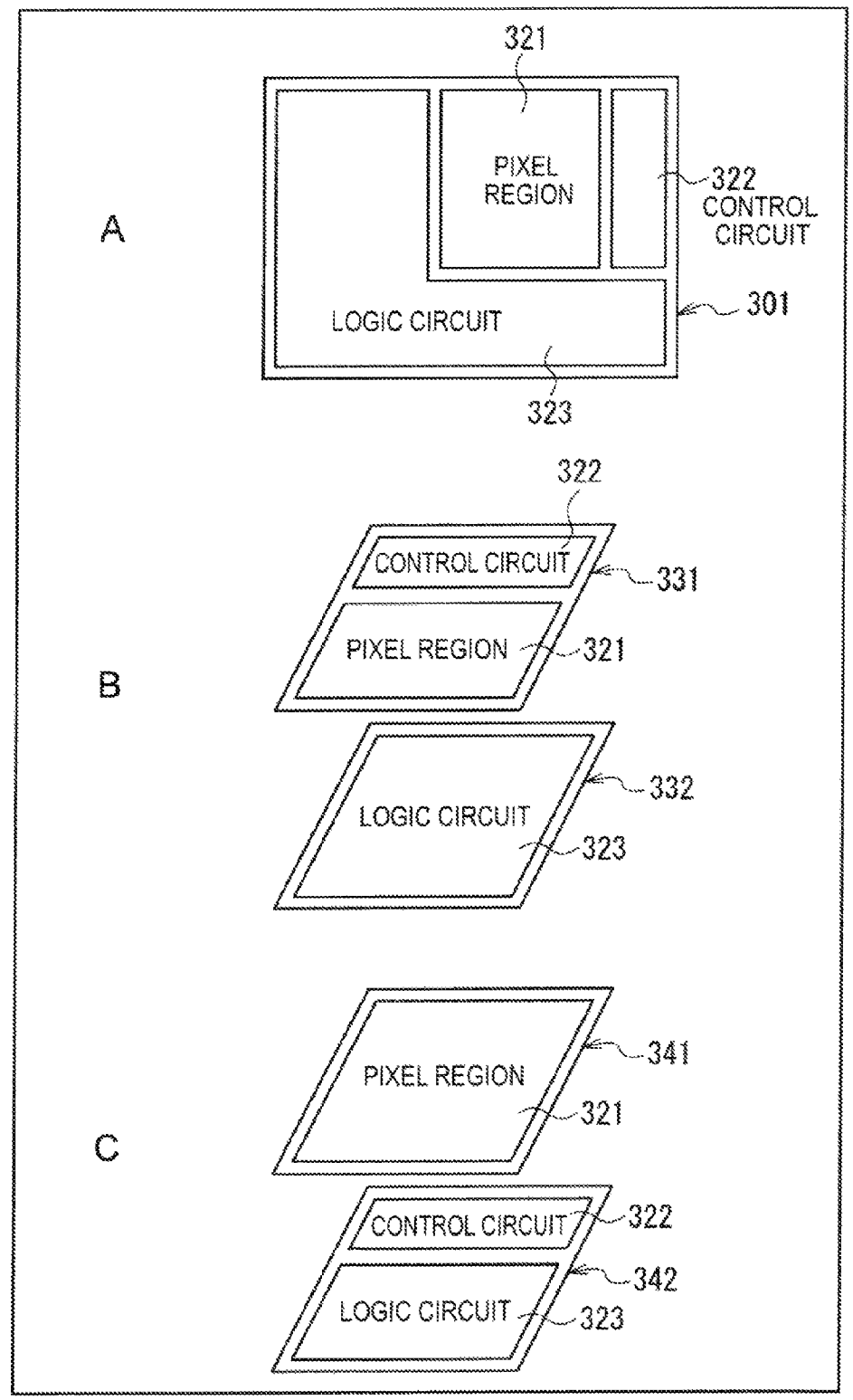
FIG. 19 is a diagram describing substrate configuration examples of the solid state imaging device.

The solid state imaging device 13 of FIG. 2 or FIG. 16 may have anyone of the substrate configurations shown in A of FIG. 19 to C of FIG. 19.

The substrate configuration shown in A of FIG. 19 is a configuration in which a pixel region 321 in which a plurality of pixels are arranged, a control circuit 322 that controls each pixel, and a logic circuit 323 including a signal processing circuit for the pixel signal are formed on one semiconductor substrate 301. The control circuit 322 is, for example, the vertical drive circuit 24, the column signal processing circuit 25, the horizontal drive circuit 26, the output, circuit 27, the control circuit 28, etc.

The substrate configuration shown in B of FIG. 19 is a configuration in which a first semiconductor substrate 331 in which the pixel region 321 and the control circuit 322 are formed and a second semiconductor substrate 332 in which the logic circuit 323 is formed are stacked. The first semiconductor substrate 331 and the second semiconductor substrate 332 are electrically connected by, for example, a through via or a metal bond of Cu—Cu.

The substrate configuration shown in C of FIG. 19 is a configuration in which a first semiconductor substrate 341 in which only the pixel region 321 is formed and a second semiconductor substrate 342 in which the control circuit 322 and the logic circuit 323 are formed are stacked. The first semiconductor substrate 341 and the second semiconductor substrate 342 are electrically connected by, for example, a through via or a metal bond of Cu—Cu.

All of the substrate configurations of A of FIG. 19 to C of FIG. 19 can suppress the degradation of the accuracy of phase difference detection by using the configuration according to each embodiment described above as the solid state imaging device 13. Therefore, the quality of the imaged image can be increased m the imaging apparatus 1, such as video cameras, digital still cameras, and camera modules for mobile devices such as mobile phones.

Although solid state imaging devices in which the first conductivity type is set to the P type, the second conductivity type is set to the N type, and electrons are used as the signal charge are described in the above examples, the technology of the present disclosure can be applied also to solid state imaging devices in which holes are used as the signal charge. That is, the first conductivity type may be set to the N type and the second conductivity type may be set to the P type, and each semiconductor region described above may be formed to be a semiconductor region of the opposite conductivity type.

The embodiment of the present disclosure is not limited to the embodiments described above, and various alterations are possible within a range not departing from the spirit of the present disclosure.

For example, a configuration in which all or part of the plurality of embodiments described above are combined may be employed.

The effects described in the present specification are only examples and are not limitative ones, and effects other than those described in the present specification may be exhibited.

Additionally, the present technology may also be configured as below.

(1)
A solid state imaging device including
a pixel array unit, in which a plurality of pixels are two-dimensionally arranged in a matrix configuration, wherein
part of the pixels in the pixel array unit include a first photoelectric conversion element and a second photoelectric conversion element configured to receive and photoelectrically convert incident light, and
a center position of a light receiving characteristic distribution of the first photoelectric conversion element and a center position of a light receiving characteristic distribution of the second photoelectric conversion element are configured so as to be the same between a central portion and a peripheral portion of the pixel array unit.

(2)
The solid state imaging device according to (1),
wherein the center position of the light receiving characteristic distribution is a centroid position of a light, receiving angle distribution.

(3)
The solid state imaging device according to (1) or (2),
wherein the first photoelectric conversion element and the second photoelectric conversion element are configured in a way that subject light at an angle close to an angle of a principal ray becomes less likely to be received with transition from a central portion toward a peripheral portion of the pixel array unit, (4)
The solid state imaging device according to any of (1) to (3),
wherein the first photoelectric conversion element and the second photoelectric conversion element are configured in a way that subject light at an angle close to an angle of a principal ray becomes less likely to be received by being formed in positions farther from an optical axis center with transition from a central portion toward a peripheral portion of the pixel array unit.

(5)
The solid state imaging device according to any of (1) to (4),
wherein an insulating layer is formed between the first photoelectric conversion element and the second photoelectric conversion element.

(6)
The solid state, imaging device according to (5), wherein
the insulating layer between the first photoelectric conversion element and the second photoelectric conversion element is formed in accordance with a distance between the first photoelectric conversion element and the second photoelectric conversion element.

(7)
The solid state imaging device according to (5) or (6),
wherein a pinning layer is formed between the first photoelectric conversion element or the second photoelectric conversion element and the insulating layer.

(8)
The solid state imaging device according to any of (1) to (7), wherein
the pixel includes at least
a charge retention unit configured to temporarily retain a charge generated by the first photoelectric conversion element and the second photoelectric conversion element, and
a reset transistor configured to reset a charge of the charge retention unit by using a reset voltage, and
the reset voltage of the reset transistor of the pixel is set to become lower with transition from a central portion toward a peripheral portion of the pixel array unit.

(9)
The solid state imaging device according to (8),
wherein the pixel, further includes
a select transistor configured to control selection of the pixel, and
an output transistor configured to output a signal of the charge retention unit as a pixel signal when the pixel is selected by the select transistor.

(10)
The solid state imaging device according to any of (3) to (9),
wherein a center position of a light receiving characteristic distribution of the first photoelectric conversion element and a center position of a light receiving characteristic distribution of the second photoelectric conversion element are configured so as to be the same between a central portion and a peripheral portion of the pixel array unit by a depleted region of the first photoelectric conversion element and the second photoelectric conversion element becoming smaller in accordance with the reset voltage.

(11)
The solid state imaging device according to any of (1) to (10),
wherein the pixel array unit includes a first vertical transfer register configured to transfer a charge generated by the first photoelectric conversion element of the pixel in a column direction and a second vertical transfer register configured to transfer a charge generated by the second photoelectric conversion element in a column direction.

(12)
The solid state imaging device according to any of (1) to (11),
wherein a microlens is formed, in units of a pixel in the pixel array unit.

(13)
The solid state imaging device according to any of (1) to (11),
wherein a microlens is formed in units of a plurality of pixels in the pixel array unit.

(14)

The solid state imaging device according to any of (1) to (13), configured by stacking a first semiconductor substrate and a second semiconductor substrate.

(15)

An electronic apparatus including
a solid state imaging device, the solid state imaging device including a pixel array unit in which a plurality of pixels are two-dimensionally arranged in a matrix configuration, wherein
part of the pixels in the pixel array unit include a first photoelectric conversion element and a second photoelectric conversion element configured to receive and photoelectrically convert incident light, and
a center position of a light receiving characteristic distribution of the first photoelectric conversion element and a center position of a light receiving characteristic distribution of the second photoelectric conversion element are configured so as to be the same between a central portion and a peripheral portion of the pixel array unit.

REFERENCE SIGNS LIST 1 imaging apparatus
13 solid state imaging device
22 pixel
22X imaging pixel
22Y phase difference pixel
23 pixel array unit
32 semiconductor substrate
PD(A), PD(B) photodiode
43 anti-reflection film (insulating layer)
47 microlens
61A, 61B transfer transistor
62 FD (floating diffusion)
63 reset transistor
64 amplifying transistor
65 select transistor
111 pinning layer
121 multi-voltage power source
143A, 143B vertical transfer register
201, 211 microlens
212 pixel
331 first semiconductor substrate
332 second semiconductor substrate
341 first semiconductor substrate
342 second semiconductor substrate

The invention claimed is:

1. A solid state imaging device, comprising
a pixel array unit which includes a plurality of pixels that are two-dimensionally arranged in a matrix configuration,
wherein a subset of pixels of the plurality of pixels in the pixel array unit includes a first photoelectric conversion element and a second photoelectric conversion element,
wherein each of the first photoelectric conversion element and the second photoelectric conversion element is configured to receive incident light and photoelectrically convert the incident light,
wherein a center position of a first light receiving angle distribution of the first photoelectric conversion element and a center position of a second light receiving angle distribution of the second photoelectric conversion element are same for a plurality of pixel positions between a central portion and a peripheral portion of the pixel array unit, and
wherein the first photoelectric conversion element and the second photoelectric conversion element are in positions farther from an optical axis center with transition from the central portion toward the peripheral portion of the pixel array unit.

2. The solid state imaging device according to claim 1, wherein the center position of the first light receiving angle distribution is a centroid position of the first light receiving angle distribution of output signal of the first photoelectric conversion element with respect to an incident angle of the incident light.

3. The solid state imaging device according to claim 1, wherein the first photoelectric conversion element and the second photoelectric conversion element are configured such that reception of subject light close to an angle of a principal ray reduces with transition from the central portion toward the peripheral portion of the pixel array unit.

4. The solid state imaging device according to claim 3, wherein the first photoelectric conversion element and the second photoelectric conversion element are configured such that the reception of the subject light close to the angle of the principal ray is reduced in positions farther from an optical axis center with the transition from the central portion toward the peripheral portion of the pixel array unit.

5. The solid state imaging device according to claim 1, further comprising an insulating layer between the first photoelectric conversion element and the second photoelectric conversion element.

6. The solid state imaging device according to claim 5, wherein the first photoelectric conversion element and the second photoelectric conversion element are in positions farther from an optical axis center with transition from the central portion toward the peripheral portion of the pixel array unit, and
wherein the insulating layer between the first photoelectric conversion element and the second photoelectric conversion element is based on a distance between the first photoelectric conversion element and the second photoelectric conversion element.

7. The solid state imaging device according to claim 5, wherein a pinning layer is formed between the first photoelectric conversion element or the second photoelectric conversion element and the insulating layer.

8. The solid state imaging device according to claim 1, wherein each pixel of the plurality of pixels includes:
a charge retention unit, wherein the charge retention unit is configured to temporarily retain a charge generated by the first photoelectric conversion element and the second photoelectric conversion element, and
a reset transistor configured to reset the charge of the charge retention unit by a reset voltage,
wherein the reset voltage of the reset transistor is reduced with transition from the central portion toward the peripheral portion of the pixel array unit.

9. The solid state imaging device according to claim 8, wherein the pixel farther includes
a select transistor configured to control selection of the pixel and
an output transistor configured to output a signal of the charge retention unit as a pixel signal when the pixel is selected by the select transistor.

10. The solid state imaging device according to claim 1, wherein a center position of a light receiving characteristic distribution of the first photoelectric conversion element and a center position of a light receiving characteristic distribution of the second photoelectric conversion element are configured so as to be the same between a central portion and a peripheral portion of the pixel array unit by a depleted region of the first photoelectric conversion element and the second photoelectric conversion element becoming smaller in accordance with the reset voltage.

11. The solid state imaging device according to claim 1, wherein the pixel array unit includes:
   a first vertical transfer register configured to transfer a first charge generated by the first photoelectric conversion element in a column direction, and
   a second vertical transfer register configured to transfer a second charge generated by the second photoelectric conversion element in the column direction.

12. The solid state imaging device according to claim 1, further comprising a microlens in the pixel array unit.

13. The solid state imaging device according to claim 1, wherein a microlens is formed in units of a plurality of pixels in the pixel array unit.

14. The solid state imaging device according to claim 1, configured by stacking a first semiconductor substrate and a second semiconductor substrate.

15. An electronic apparatus, comprising:
   a solid state imaging device including a pixel array unit, wherein the pixel array unit includes a plurality of pixels that are two-dimensionally arranged in a matrix configuration,
      wherein a subset of pixels of the plurality of pixels in the pixel array unit includes a first photoelectric conversion element and a second photoelectric conversion element,
      wherein each of the first photoelectric conversion element and the second photoelectric conversion element is configured to receive incident light and photoelectrically convert the incident light,
      wherein a center position of a first light receiving angle distribution of the first photoelectric conversion element and a center position of a second light receiving angle distribution of the second photoelectric conversion element are same for a plurality of pixel positions between a central portion and a peripheral portion of the pixel array unit, and
      wherein the first photoelectric conversion element and the second photoelectric conversion element are in positions farther from an optical axis center with transition from the central portion toward the peripheral portion of the pixel array unit.

16. A solid state imaging device, comprising
a pixel array unit which includes a plurality of pixels that are two-dimensionally arranged in a matrix configuration,
   wherein a subset of pixels of the plurality of pixels in the pixel array unit includes a first photoelectric conversion element and a second photoelectric conversion element,
   wherein each of the first photoelectric conversion element and the second photoelectric conversion element is configured to receive incident light and photoelectrically convert the incident light,
   wherein a center position of a light receiving angle distribution of the first photoelectric conversion element and a center position of a light receiving angle distribution of the second photoelectric conversion element are same for a plurality of pixel positions between a central portion and a peripheral portion of the pixel array unit, and
   wherein each pixel of the plurality of pixels includes:
      a charge retention unit configured to temporarily retain a charge generated by the first photoelectric conversion element and the second photoelectric conversion element, and
      a reset transistor configured to reset the charge of the charge retention unit by a reset voltage,
         wherein the reset voltage of the reset transistor is reduced with transition from the central portion toward the peripheral portion of the pixel array unit.

* * * * *